US012638866B2

(12) United States Patent
Kim et al.

(10) Patent No.: US 12,638,866 B2
(45) Date of Patent: May 26, 2026

(54) MASS FLOW CONTROLLER, FLOW CONTROL METHOD USING THE SAME, AND SUBSTRATE PROCESSING METHOD INCLUDING THE SAME

(71) Applicant: Samsung Electronics Co., Ltd., Suwon-si (KR)

(72) Inventors: Seunghun Kim, Suwon-si (KR); Donghoon Park, Suwon-si (KR); Minjung Kim, Suwon-si (KR); Geongu Jang, Suwon-si (KR); Taemin Kim, Suwon-si (KR); Jiho Uh, Suwon-si (KR); Jinseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 17 days.

(21) Appl. No.: 18/782,633

(22) Filed: Jul. 24, 2024

(65) Prior Publication Data

US 2025/0216872 A1     Jul. 3, 2025

(30) Foreign Application Priority Data

Jan. 3, 2024     (KR) ........................ 10-2024-0001197

(51) Int. Cl.
*G05D 7/06*          (2006.01)
*H01J 37/305*       (2006.01)
(Continued)

(52) U.S. Cl.
CPC ........ *G05D 7/0635* (2013.01); *H01J 37/3053* (2013.01); *H01J 37/32449* (2013.01);
(Continued)

(58) Field of Classification Search
CPC . G05D 7/0635; G05D 7/0629; H01J 37/3053; H01J 37/32449; H01J 2237/006;
(Continued)

(56) References Cited

U.S. PATENT DOCUMENTS

| | | | |
|---|---|---|---|
| 6,062,246 A | 5/2000 | Tanaka et al. | |
| 6,062,256 A | 5/2000 | Miller et al. | |

(Continued)

FOREIGN PATENT DOCUMENTS

| | | |
|---|---|---|
| JP | 2005-347484 A | 12/2005 |

*Primary Examiner* — Minh Q Le
(74) *Attorney, Agent, or Firm* — Muir Patent Law, PLLC

(57)          ABSTRACT

Disclosed are mass flow controllers of a substrate processing apparatus, flow control methods the substrate processing apparatus, and substrate processing methods. The flow control method comprises receiving a mode selection signal, controlling a flow control valve under a first mode to allow a flow rate of fluid to change by a first flow rate, and controlling the flow control valve under a second mode to allow the flow rate of fluid to change by a second flow rate. The step of controlling the flow control valve under the first mode includes applying a first voltage to a first piezoelectric stack assembly of a piezoelectric actuator connected to the flow control valve. The step of controlling the flow control valve under the second mode includes applying a second voltage to a second piezoelectric stack assembly disposed on the first piezoelectric stack assembly. The second voltage is different from the first voltage.

20 Claims, 18 Drawing Sheets

(51) Int. Cl.

| | |
|---|---|
| *H01J 37/32* | (2006.01) |
| *F16K 31/00* | (2006.01) |
| *F16K 37/00* | (2006.01) |
| *F16K 51/02* | (2006.01) |
| *G01F 1/56* | (2006.01) |
| *H10P 72/00* | (2026.01) |

(52) U.S. Cl.
CPC .......... *F16K 31/007* (2013.01); *F16K 37/005* (2013.01); *F16K 51/02* (2013.01); *G01F 1/56* (2013.01); *G05D 7/0629* (2013.01); *H01J 2237/006* (2013.01); *H01J 2237/3321* (2013.01); *H01J 2237/334* (2013.01); *H10P 72/0402* (2026.01); *H10P 72/0604* (2026.01)

(58) Field of Classification Search
CPC ........ H01J 2237/334; H01J 2237/3321; F16K 31/007; F16K 37/005; F16K 51/02; G01F 1/56; H10P 72/0402; H10P 72/0604
USPC ..................................................... 137/624.12
See application file for complete search history.

(56) References Cited

U.S. PATENT DOCUMENTS

| | | | | |
|---|---|---|---|---|
| 6,170,526 | B1 * | 1/2001 | O'Neill ................. | F16K 31/007 137/625.65 |
| 6,926,774 | B2 | 8/2005 | Yoshidome et al. | |
| 7,484,940 | B2 | 2/2009 | O'Neill | |
| 7,851,969 | B2 | 12/2010 | Ota | |
| 7,990,023 | B2 * | 8/2011 | De Paoli ............... | H10N 30/50 310/340 |
| 8,132,594 | B2 | 3/2012 | Burkhart et al. | |
| 8,138,658 | B2 | 3/2012 | Kushnir et al. | |
| 9,523,435 | B2 | 12/2016 | Monkowski et al. | |
| 10,400,906 | B2 | 9/2019 | Shirey et al. | |
| 10,920,898 | B2 | 2/2021 | Miyamoto | |
| 10,921,827 | B1 | 2/2021 | Xu et al. | |
| 10,921,828 | B2 | 2/2021 | Ando et al. | |
| 2006/0049715 | A1 | 3/2006 | Onishi | |
| 2010/0000608 | A1 * | 1/2010 | Goto ...................... | G01F 25/15 137/455 |
| 2011/0138593 | A1 | 6/2011 | Schuh et al. | |
| 2012/0273061 | A1 * | 11/2012 | Hidaka .................... | F16K 7/14 251/129.01 |
| 2017/0102095 | A1 * | 4/2017 | Kunita ................ | F16K 37/0041 |
| 2018/0003312 | A1 * | 1/2018 | Schupp ................. | F16K 31/004 |
| 2020/0166150 | A1 * | 5/2020 | Miyamoto ......... | G05D 16/2013 |
| 2020/0348158 | A1 * | 11/2020 | Sugita .................. | G05D 7/0635 |
| 2021/0010608 | A1 * | 1/2021 | Brown ................... | F16K 27/02 |
| 2021/0239230 | A1 * | 8/2021 | Dohi .................... | G05D 7/0647 |
| 2021/0355583 | A1 * | 11/2021 | Kanamaru ........... | G05D 7/0664 |
| 2023/0200249 | A1 * | 6/2023 | Inoue ..................... | H10N 30/80 310/311 |
| 2023/0266156 | A1 * | 8/2023 | Ding .................... | G05D 7/0635 137/12 |
| 2025/0046579 | A1 * | 2/2025 | Sakaue ................. | H01J 37/321 |

* cited by examiner

MASS FLOW CONTROLLER, FLOW CONTROL METHOD USING THE SAME, AND SUBSTRATE PROCESSING METHOD INCLUDING THE SAME

CROSS-REFERENCE TO RELATED APPLICATION

This U.S. nonprovisional application claims priority under 35 U.S.C. § 119 to Korean Patent Application No. 10-2024-0001197 filed on Jan. 3, 2024 in the Korean Intellectual Property Office, the disclosure of which is hereby incorporated by reference in its entirety.

BACKGROUND

Aspects of the present inventive concept relate to a mass flow controller, a flow control method using the same, and a substrate processing method including the same, and more particularly, to a mass flow controller capable of precisely controlling various flow rates, a flow control method using the same, and a substrate processing method including the same.

A semiconductor device may be fabricated through various processes. For example, the semiconductor device may be manufactured through a photolithography process, an etching process, a deposition process, and a plating process on a substrate. Various kinds of fluid may be used for substrate processes. For example, a gas may be supplied to a substrate processing apparatus for etching process and/or deposition process. A mass flow controller may be used to control a flow rate of fluid supplied to the substrate processing apparatus.

SUMMARY

Embodiments of the present inventive concept provide a mass flow controller capable of precisely controlling a fine flow rate, a flow control method using the same, and a substrate processing method including the same.

Embodiments of the present inventive concept provide a mass flow controller in which a single piezoelectric actuator is employed to precisely control a wide range of flow rate, a flow control method using the same, and a substrate processing method including the same.

Embodiments of the present inventive concept provide a mass flow controller capable of simplifying an overall facility, a flow control method using the same, and a substrate processing method including the same.

Embodiments of the present inventive concept provide a mass flow controller capable of reducing a facility occupying area, a flow control method using the same, and a substrate processing method including the same.

The object of the present inventive concept is not limited to the mentioned above, and other objects which have not been mentioned above will be clearly understood to those skilled in the art from the following description.

According to embodiments of the present inventive concept, a flow control method of substrate processing apparatus comprises: receiving a mode selection signal; in response to the mode selection signal indicating a first mode, controlling a flow control valve under the first mode to allow a flow rate of fluid to change by a first flow rate, the flow control valve being connected to a flow path connecting a fluid supply system to the substrate processing apparatus, and the fluid flowing in the flow path; and in response to the mode selection signal indicating a second mode, controlling the flow control valve under the second mode to allow the flow rate of fluid in the flow path to change by a second flow rate. The step of controlling the flow control valve under the first mode may include applying a first voltage to a first piezoelectric stack assembly of a piezoelectric actuator connected to the flow control valve. The step of controlling the flow control valve under the second mode may include applying a second voltage to a second piezoelectric stack assembly disposed on the first piezoelectric stack assembly, the second voltage being different from the first voltage, wherein the first flow rate is different from the second flow rate.

According to embodiments of the present inventive concept, a substrate processing method comprising: placing a substrate in a substrate processing apparatus; and allowing a gas supply system to supply a process gas to the substrate processing apparatus. The step of supplying the process gas to the substrate processing apparatus includes: starting to supply the process gas to the substrate processing apparatus; and changing a flow rate of the process gas during the supply of the process gas. The step of changing the flow rate of the process gas includes: calculating a first value that is a difference between a target value of the flow rate of the process gas and a current flow rate of the process gas; and controlling a flow control valve of the gas supply system based on the first value. The step of controlling the flow control valve includes: when the first value is less than a first reference flow rate, controlling the flow control valve under a first mode; and when the first value is greater than the first reference flow rate, controlling the flow control valve under a second mode. The step of controlling the flow control valve under the first mode includes applying a first voltage to a first piezoelectric stack assembly of a piezoelectric actuator connected to the flow control valve. The step of controlling the flow control valve under the second mode includes applying a second voltage to a second piezoelectric stack assembly on the first piezoelectric stack assembly, the second voltage being greater than the first voltage.

According to embodiments of the present inventive concept, a mass flow controller of a substrate processing apparatus comprises: a flow control valve disposed in a flow path connecting a gas supply system to the substrate processing apparatus; a piezoelectric actuator connected to the flow control valve and configured to drive the flow control valve; and a voltage supply device that applies a voltage to the piezoelectric actuator. The piezoelectric actuator may include: a first piezoelectric stack assembly that includes a plurality of first piezoelectric stacks; and a second piezoelectric stack assembly that includes a plurality of second piezoelectric stacks and is disposed on the first piezoelectric stack assembly. The voltage supply device may include: a first voltage supply device electrically connected to the first piezoelectric stack assembly so as to apply a first voltage to the first piezoelectric stack assembly; and a second voltage supply device electrically connected to the second piezoelectric stack assembly so as to apply a second voltage to the second piezoelectric stack assembly. Details of other example embodiments are included in the description and drawings.

DETAILED DESCRIPTION OF EMBODIMENTS

Figure 1:
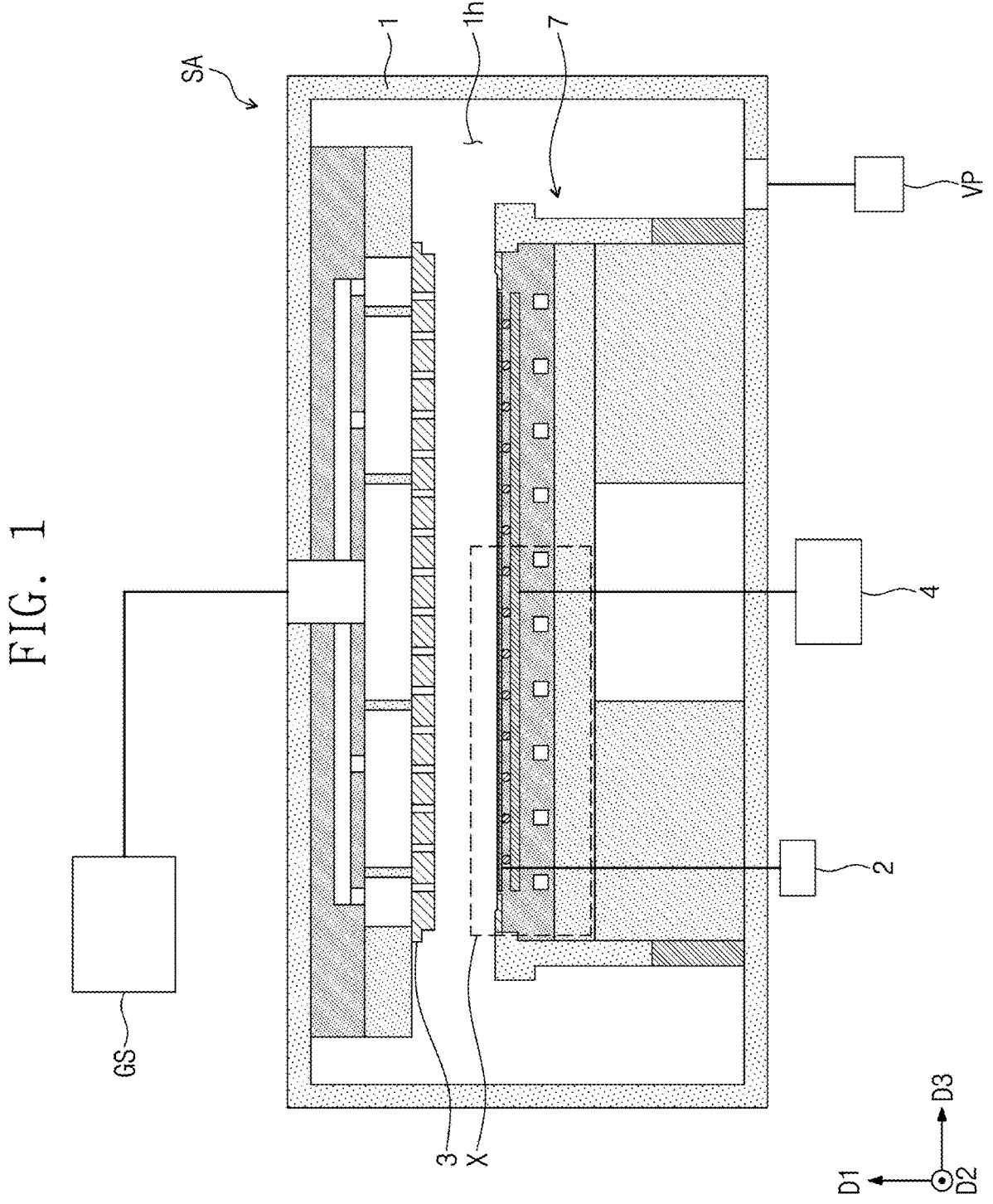
FIG. 1 illustrates a simplified schematic diagram showing a substrate processing system according to embodiments of the present inventive concept.

The following will now describe embodiments of the present inventive concept with reference to the accompanying drawings. Like reference numerals may indicate like components throughout the description.

Figure 2:
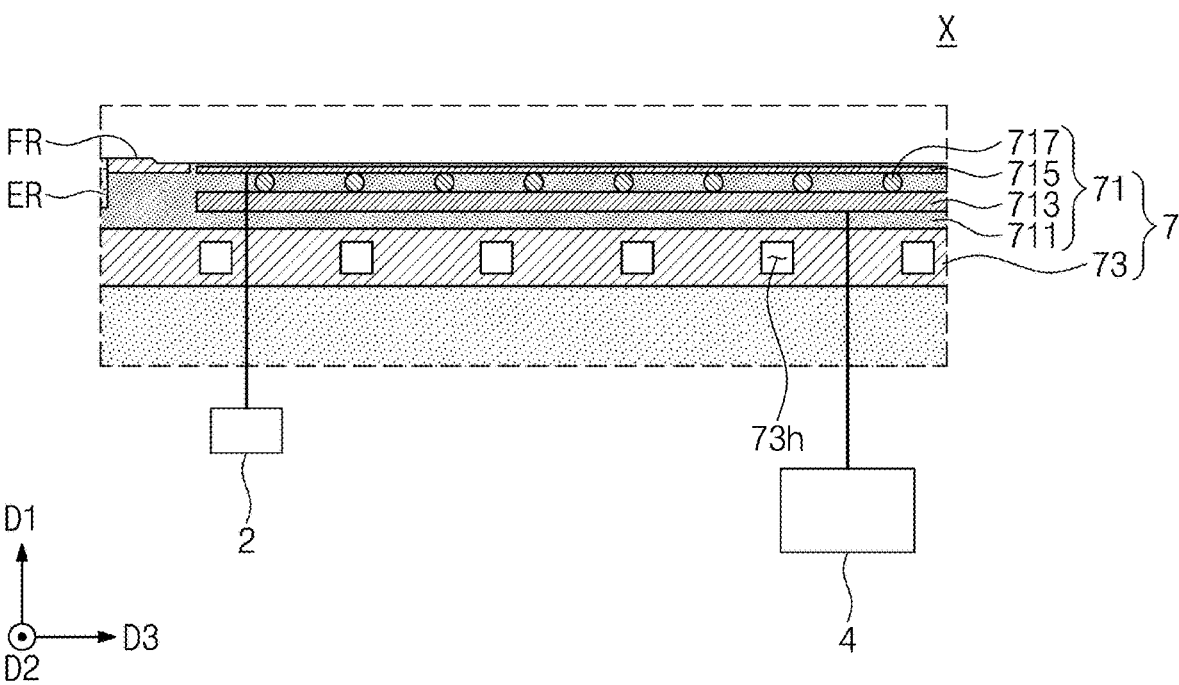
FIG. 2 illustrates an enlarged cross-sectional view showing section X of FIG. 1.

FIG. 1 illustrates a simplified schematic diagram showing a substrate processing system according to embodiments of the present inventive concept. FIG. 2 illustrates an enlarged cross-sectional view showing section X of FIG. 1.

In this description, symbol D1 may indicate a first direction, symbol D2 may indicate a second direction that intersects the first direction D1, and symbol D3 may indicate a third direction that intersects each of the first direction D1 and the second direction D2.

Referring to FIG. 1, a substrate processing apparatus SA and a gas supply system GS may be provided.

The substrate processing apparatus SA may perform a process on a substrate. The substrate processing apparatus SA may be configured such that a gas is used to perform a semiconductor fabrication process on a substrate. For example, the substrate processing apparatus SA may perform an etching process and/or a deposition process on a substrate. A term "substrate" used in this description may mean a silicon (Si) wafer, but aspects of the present inventive concept are not limited thereto. The substrate processing apparatus SA may use plasma to process a substrate. In this sense, the substrate processing apparatus SA may be a plasma etching apparatus. The substrate processing apparatus SA may convert a portion of gas supplied from the gas supply system GS into plasma. The substrate processing apparatus SA may generate plasma in various ways. For example, the substrate processing apparatus SA may be a capacitively coupled plasma (CCP) apparatus and/or an inductively coupled plasma (ICP) apparatus. For convenience, the following will illustrate and discuss a CCP type substrate processing apparatus. The substrate processing apparatus SA may include a process chamber 1, a stage 7, a showerhead 3, a direct-current (DC) power generator 2, a radio-frequency (RF) power generator 4, and a vacuum pump VP.

The process chamber 1 may provide a process space 1h. A substrate process may be performed in the process space 1h. The process space 1h may be isolated from an external space. During a substrate process, the process space 1h may be in a substantial vacuum state. The process chamber 1 may have a cylindrical shape, but aspects of the present inventive concept are not limited thereto.

The stage 7 may be positioned in the process chamber 1. For example, the stage 7 may be positioned in the process space 1h. The stage 7 may support and/or fix a substrate. A substrate process may be performed in a state where a substrate is placed on the stage 7. The stage 7 will be further discussed in detail below.

The showerhead 3 may be positioned in the process chamber 1. For example, the showerhead 3 may be positioned in the process space 1h. The showerhead 3 may be disposed upwardly spaced apart (e.g., in the first direction D1) from the stage 7. A gas supplied from the gas supply system GS may be uniformly sprayed through the showerhead 3 into the process space 1h.

The DC power generator 2 may apply a DC power to the stage 7. The DC power applied from the DC power generator 2 may rigidly place a substrate on a certain position on the stage 7.

The RF power generator 4 may supply a RF power to the stage 7. It may thus be possible to control plasma in the process space 1h. A detailed description thereof will be further discussed below.

The vacuum pump VP may be connected to the process space 1h. The vacuum pump VP may apply a vacuum pressure to the process space 1h while a substrate process is performed.

Referring to FIG. 2, the stage 7 may include a chuck 71 and a cooling plate 73.

A substrate may be disposed on the chuck 71. The chuck 71 may fix a substrate on a certain position thereof. The chuck 71 may include a chuck body 711, a plasma electrode 713, a chuck electrode 715, and a heater 717.

The chuck body 711 may have a cylindrical shape. The chuck body 711 may include a ceramic, but aspects of the present inventive concept are not limited thereto. A substrate may be disposed on a top surface of the chuck body 711. The chuck body 711 may be surrounded by a focus ring FR and/or an edge ring ER.

The plasma electrode 713 may be positioned in the chuck body 711. The plasma electrode 713 may include aluminum (Al). The plasma electrode 713 may have a circular plate shape, but aspects of the present inventive concept are not limited thereto. A RF power may be applied to the plasma electrode 713. For example, the RF power generator 4 may apply a RF power to the plasma electrode 713. The RF power applied to the plasma electrode 713 may control plasma in the process space (see 1h of FIG. 1). For example, the stage 7 may include an electrostatic chuck (ESC).

The chuck electrode 715 may be positioned in the chuck body 711. The chuck electrode 715 may be positioned higher (e.g., in the first direction D1) than the plasma electrode 713. A DC power may be applied to the chuck electrode 715. For example, the DC power generator 2 may apply the DC power to the chuck electrode 715. The DC power applied to the chuck electrode 715 may rigidly place a substrate on a certain position on the chuck body 711. The chuck electrode 715 may include aluminum (Al), but aspects of the present inventive concept are not limited thereto.

The heater 717 may be positioned in the chuck body 711. The heater 717 may be positioned between the chuck electrode 715 and the plasma electrode 713. The heater 717 may include a hot wire. For example, the heater 717 may include a concentrically circular shaped hot wire. The heater 717 may radiate heat to the surrounding environment. Therefore, the chuck body 711 may have an increased temperature.

The cooling plate 73 may be positioned under the chuck 71. For example, the chuck 71 may be positioned on the cooling plate 73. The cooling plate 73 may provide a cooling hole 73h. Cooling water may flow in the cooling hole 73h. The cooling water in the cooling hole 73h may absorb heat from the cooling plate 73.

It is illustrated and discussed that the substrate processing apparatus SA uses plasma to process a substrate, but aspects of the present inventive concept are not limited thereto. The substrate processing apparatus SA may include other types of device in which a gas is used to process a substrate. The substrate processing apparatus SA may include, for example, a vertical furnace that performs a deposition process on a plurality of vertically stacked substrates. For example, the substrate processing apparatus SA may include a batch-type deposition apparatus. Alternatively, the substrate processing apparatus SA may include other types of device in which a gas (i.e., fluid) is used to process a substrate.

The gas supply system GS may be connected to the substrate processing apparatus SA. The gas supply system GS may supply a fluid to the substrate processing apparatus SA. The gas supply system GS may supply, for example, a gas to the substrate processing apparatus SA. In such a case, the gas supply system GS may supply the substrate processing apparatus SA with one or more of an oxygen ($O_2$) gas, an argon (Ar) gas, air, and a neon (Ne) gas. Aspects of the present inventive concept, however, are not limited thereto, and the gas supply system GS may supply the substrate processing apparatus SA with other types of gas and/or liquid. The gas supply system GS may supply the substrate processing apparatus SA with a fluid at various flow rates. A detailed description thereof will be further discussed below.

Figure 3:
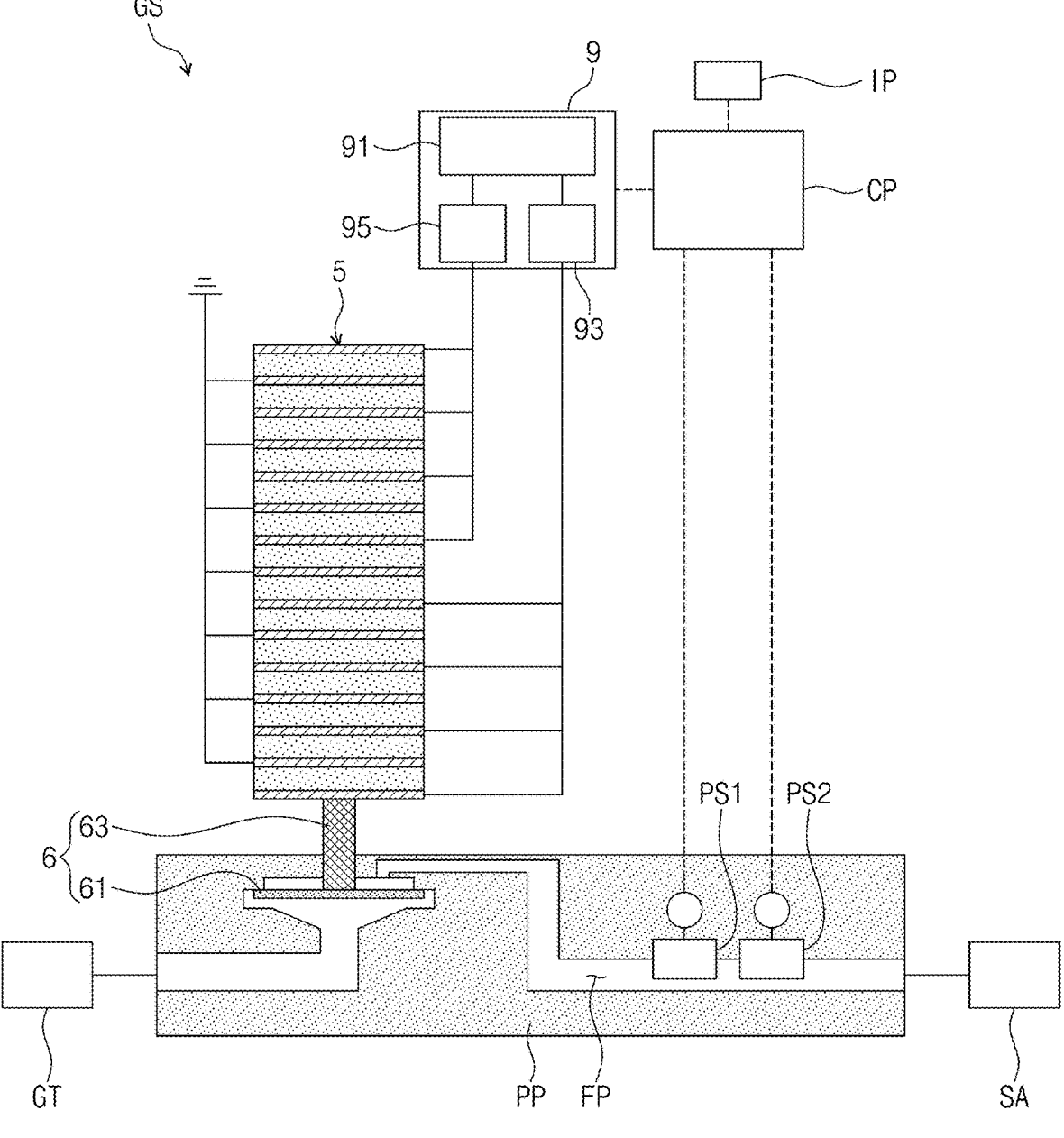
FIG. 3 illustrates a simplified schematic diagram showing a gas supply system according to embodiments of the present inventive concept.
Figure 4:
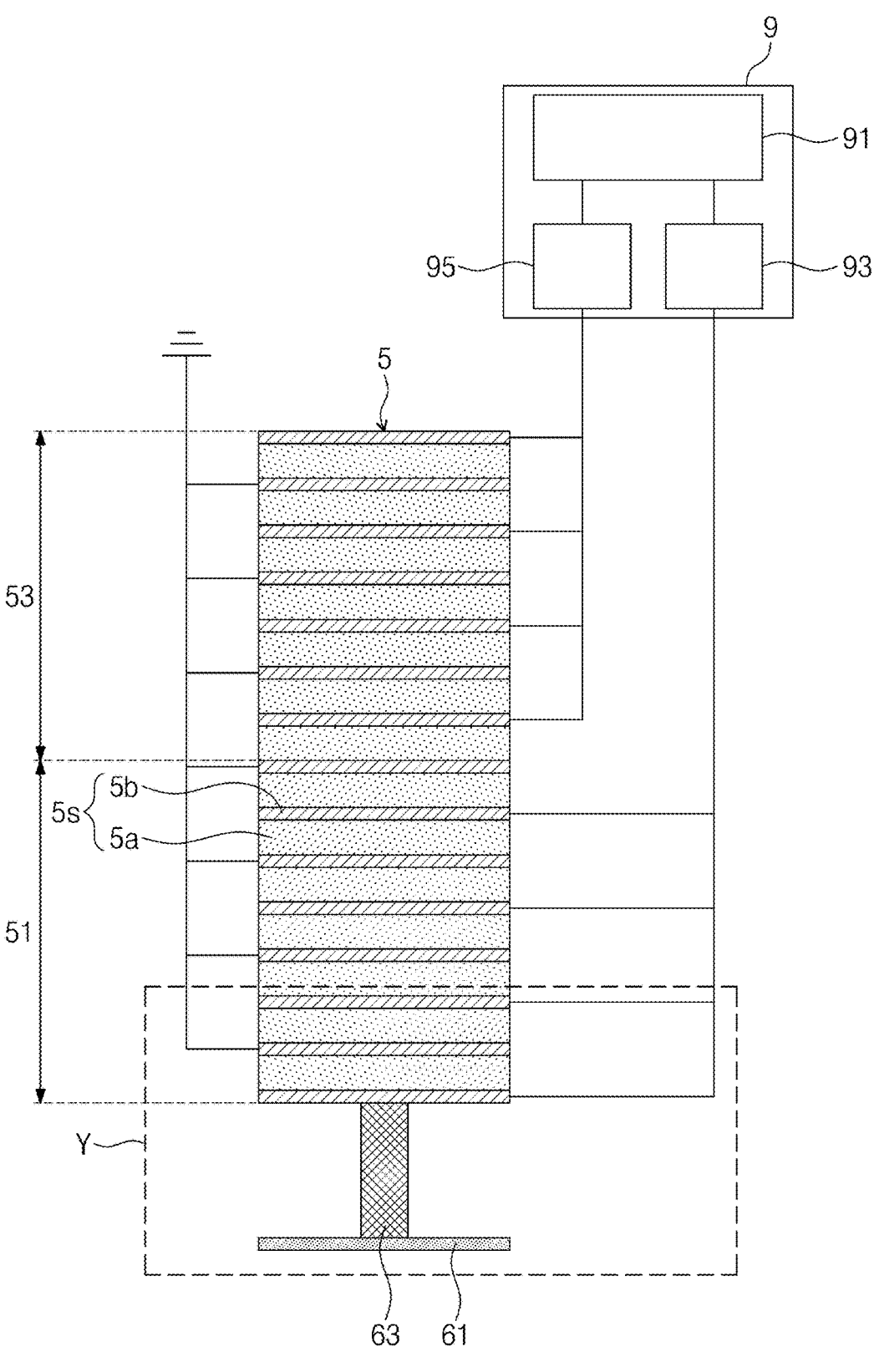
FIG. 4 illustrates an enlarged view partially showing a gas supply system according to embodiments of the present inventive concept.
Figure 5:
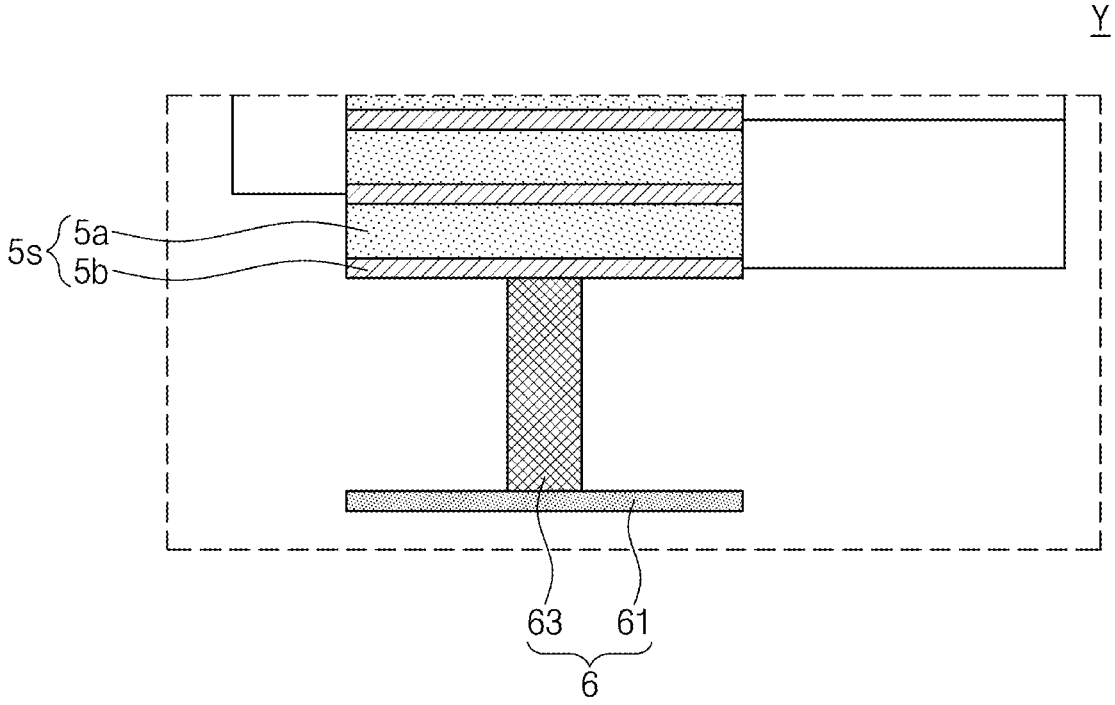
FIG. 5 illustrates an enlarged view showing section Y of FIG. 4.

FIG. 3 illustrates a simplified schematic diagram showing a gas supply system according to embodiments of the present inventive concept. FIG. 4 illustrates an enlarged view partially showing a gas supply system according to embodiments of the present inventive concept. FIG. 5 illustrates an enlarged view showing section Y of FIG. 4.

Referring to FIGS. 3 to 5, the gas supply system GS may include a gas tank GT, a supply line PP, and a mass flow controller.

The gas tank GT may store a gas. For example, the gas tank GT may store one or more of an oxygen ($O_2$) gas, an argon (Ar) gas, air, and a neon (Ne) gas. The gas tank GT may be connected to the supply line PP. A gas stored in the gas tank GT may be supplied through the supply line PP to the substrate processing apparatus SA.

The supply line PP may be connected to the gas tank GT. The supply line PP may connect the gas tank GT to the substrate processing apparatus SA. The supply line PP may provide a flow path FP. A fluid discharged from the gas tank GT may move along the flow path FP to be supplied to the substrate processing apparatus SA.

The mass flow controller may be connected to the supply line PP. The mass flow controller may control a flow rate of fluid discharged from the gas tank GT. For example, the mass flow controller may control a flow rate of fluid that is supplied from the gas GT and passes through the supply line PP. The mass flow controller may include a flow control valve 6, a piezoelectric actuator 5, a voltage supply device 9, a control part CP, an interface part IP, and a flow sensor.

The flow control valve 6 may be connected to the flow path FP. The flow control valve 6 may control a flow rate of fluid that flows in the flow path FP. For example, at least a portion of the flow control valve 6 may be positioned in the flow path FP, and a movement of the flow control valve 6 may change the degree of opening of the flow path FP. The flow control valve 6 may be connected to the piezoelectric actuator 5. For example, the piezoelectric actuator 5 may drive the flow control valve 6 to move. The flow control valve 6 may include a membrane 61 and a connection member 63. At least a portion of the membrane 61 may be positioned in the flow path FP. The membrane 61 may have a film (e.g., flat or substantially flat) shape that extends in a horizontal direction, but aspects of the present inventive concept are not limited thereto. The connection member 63 may connect the membrane 61 to the piezoelectric actuator 5. The connection member 63 may have a rod shape that upwardly extends from the membrane 61 and is connected to the piezoelectric actuator 5, but aspects of the present inventive concept are not limited thereto.

The piezoelectric actuator 5 may be connected to the flow control valve 6. The piezoelectric actuator 5 may drive the flow control valve 6 to move. The piezoelectric actuator 5 may include a piezoelectric stack 5s. The piezoelectric stack 5s may include a piezoelectric material layer 5a and an electrode 5b.

The piezoelectric material layer 5a may include a piezoelectric material. The piezoelectric material layer 5a may include a material that exhibits an piezoelectric effect. For example, the piezoelectric material layer 5a may include one or more of quartz, Rocelle salt, and polyvinylidene fluoride (PVDF). The piezoelectric material layer 5a may have a film (e.g., flat or substantially flat) shape, but aspects of the present inventive concept are not limited thereto.

The electrode 5b may be positioned on the piezoelectric material layer 5a. For example, the electrode 5b may be in contact with one surface of the piezoelectric material layer 5a. The electrode 5b may include a conductive material. For example, the electrode 5b may include one or more of aluminum (Al), copper (Cu), and silicon (Si). The electrode 5b may be electrically connected to the voltage supply device 9. The voltage supply device 9 may apply a voltage to the electrode 5b. A detailed description thereof will be further discussed below.

The piezoelectric stack 5s may be provided in plural. The plurality of piezoelectric stacks 5s may be vertically stacked. For example, the piezoelectric actuator 5 according to aspects of the present inventive concept may be a multilayer piezoelectric actuator. An aggregate of the plurality of piezoelectric stacks 5s may be called a piezoelectric stack assembly. One voltage may be applied to a single piezoelectric stack assembly. A plurality of voltages may be applied to a single piezoelectric actuator 5. A single piezoelectric actuator 5 may include a plurality of piezoelectric stack assemblies. For example, the piezoelectric actuator 5 may include a first piezoelectric stack assembly 51 and a second piezoelectric stack assembly 53.

The first piezoelectric stack assembly 51 may include a plurality of piezoelectric stacks 5s. A first piezoelectric stack may refer to each of the plurality of piezoelectric stacks 5s included in the first piezoelectric stack assembly 51. A first piezoelectric material layer may refer to a piezoelectric material layer of the first piezoelectric stack. The first piezoelectric material layer may include a first piezoelectric material. The first piezoelectric material may be substantially the same as or similar to the piezoelectric material mentioned above, but according to aspects of the present inventive concept are not limited thereto. A first electrode may refer to an electrode of the first piezoelectric stack. The first piezoelectric stack assembly 51 may be electrically connected to the voltage supply device 9. For example, the first electrode may be electrically connected to the voltage supply device 9. The first piezoelectric stack assembly 51 may be provided with a first voltage from the voltage supply device 9. A detailed description thereof will be further discussed below.

The second piezoelectric stack assembly 53 may be stacked on the first piezoelectric stack assembly 51. The second piezoelectric stack assembly 53 may include a plurality of piezoelectric stacks 5s. A second piezoelectric stack may refer to each of the plurality of piezoelectric stacks 5s included in the second piezoelectric stack assembly 53. A second piezoelectric material layer may refer to a piezoelectric material layer of the second piezoelectric stack. The second piezoelectric material layer may include a second piezoelectric material. The second piezoelectric material may be substantially the same as or similar to the piezoelectric material mentioned above, but according to aspects of the present inventive concept are not limited thereto. A second electrode may refer to an electrode of the second piezoelectric stack. The second piezoelectric stack assembly 53 may be electrically connected to the voltage supply device 9. For example, the second electrode may be electrically connected to the voltage supply device 9. The second piezoelectric stack assembly 53 may be provided with a second voltage from the voltage supply device 9. A detailed description thereof will be further discussed below. The number of the second piezoelectric stacks provided in the second piezoelectric stack assembly 53 may be the same as the number of the first piezoelectric stacks provided in the first piezoelectric stack assembly 51. Aspects of present inventive concept, however, are not limited thereto, and the number of the second piezoelectric stacks provided in the second piezoelectric stack assembly 53 may be different from the number of the first piezoelectric stacks provided in the first piezoelectric stack assembly 51. A detailed description thereof will be further discussed below. Unless otherwise particularly stated, a single piezoelectric stack 5s will be discussed in the interest of convenience.

The voltage supply device 9 may be electrically connected to the piezoelectric actuator 5. For example, the voltage supply device 9 may apply the first voltage to the first piezoelectric stack assembly 51. In addition, the voltage supply device 9 may apply the second voltage to the second piezoelectric stack assembly 53. The voltage supply device 9 may include a power source 91, a first voltage supply device 93, and a second voltage supply device 95.

The power source 91 may supply a voltage to each of the first voltage supply device 93 and the second voltage supply device 95.

The first voltage supply device 93 may be electrically connected to the first piezoelectric stack assembly 51. For example, the first voltage supply device 93 may be electrically connected to the first electrode. The first voltage supply device 93 may apply the first voltage to the first electrode.

The second voltage supply device 95 may be electrically connected to the second piezoelectric stack assembly 53. For example, the second voltage supply device 95 may be electrically connected to the second electrode. The second voltage supply device 95 may apply the second voltage to the second electrode.

Each of the first voltage and the second voltage may be a direct-current (DC) voltage. The second voltage may be different from the first voltage. For example, the second voltage may be greater than the first voltage. That is, the first voltage may be less than the second voltage. A detailed description thereof will be further discussed below.

The control part CP may control the voltage supply device 9. The control part CP may receive a signal from a pressure sensor. In addition, the control part CP may receive a signal from the interface part IP. Based on a signal that is input from the pressure sensor and/or the interface part IP, the control part CP may control the voltage supply device 9. The control part CP may include, for example, one or more of a central processing unit (CPU) and a graphic processing unit (GPU). For example, the control part CP may include a computer. Aspects of the present inventive concept, however, are not limited thereto.

The interface part IP may input a signal to the control part CP. For example, the interface part IP may provide the control part CP with a user's input signal. The interface part IP may include one or more of a keyboard and mouse, but aspects of the present inventive concept are not limited thereto.

The flow sensor may measure a flow rate in the flow path FP. A portion of the flow sensor may be exposed to the flow path FP. The control part CP may receive data measured by the flow sensor. The flow sensor may use various ways to measure a flow rate in the flow path FP. The flow sensor may include, for example, one or more of a mechanical flowmeter, a differential pressure flowmeter, an electromagnetic flowmeter, and an ultrasonic flowmeter. The flow sensor may be provided in plural. For example, a first flow sensor PS1 and a second flow sensor PS2 may be provided. The first flow sensor PS1 and the second flow sensor PS2 may be disposed spaced apart from each other in a traveling direction of the flow path FP. A single flow sensor will be discussed below in the interest of convenience.

It is described that the mass flow controller controls a flow rate of gas, but aspects of the present inventive concept are not limited thereto. For example, the mass flow controller may be used to control mass of fluid.

Figure 6:
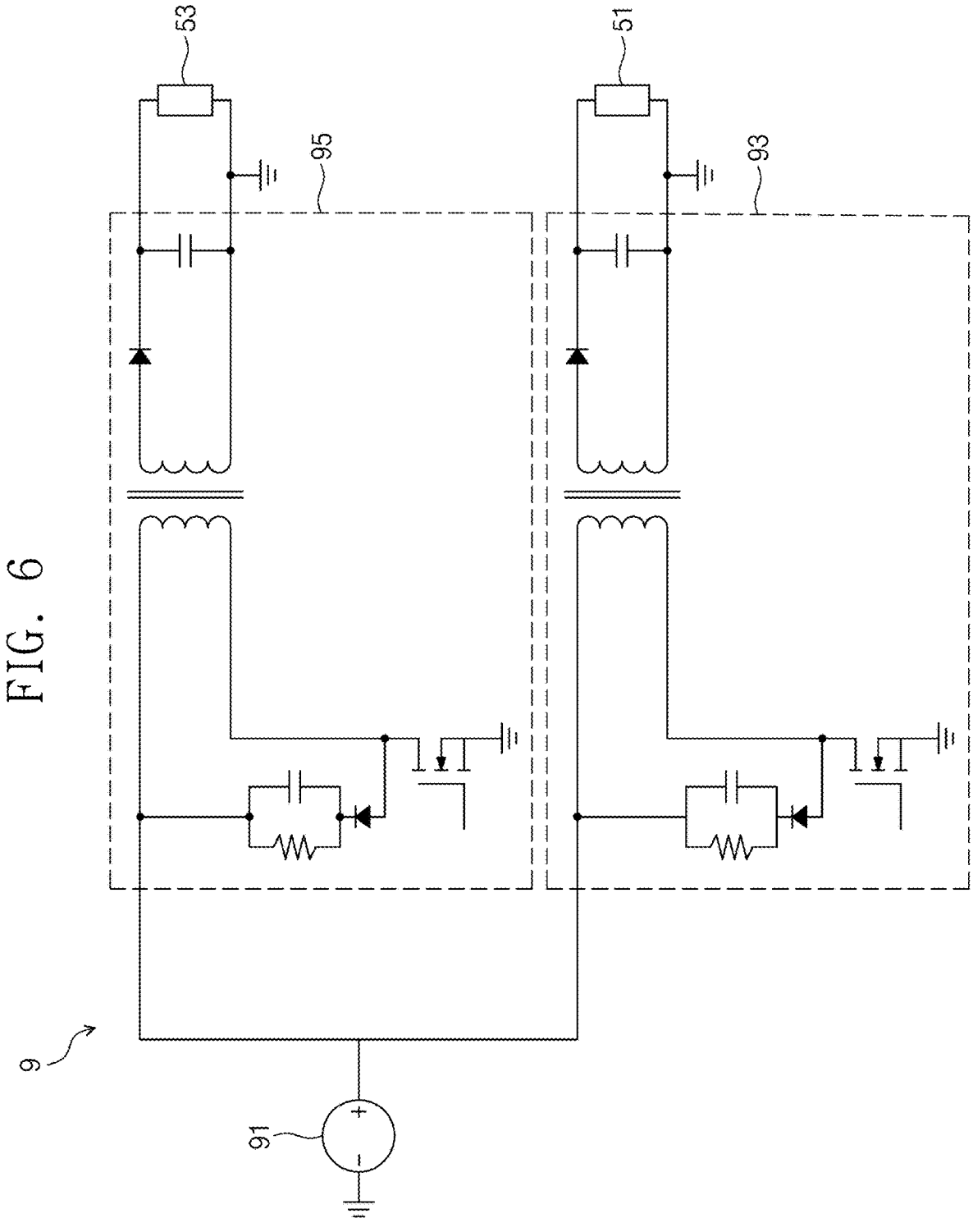
FIG. 6 illustrates a circuit diagram showing a voltage supply apparatus according to exemplary embodiments of the present inventive concept.

FIG. 6 illustrates a circuit diagram showing a voltage supply apparatus according to exemplary embodiments of the present inventive concept.

Referring to FIG. 6, the power source 91 may include, for example, a direct-current power source.

The first voltage supply device 93 may include an isolated DC-DC converter. The term "isolated DC-DC converter" used in this description may indicate, for example, a flyback converter. For example, as shown in FIG. 6, the isolated DC-DC converter may include a transformer. Aspects of the present inventive concept, however, are not limited thereto. A first isolated DC-DC converter may refer to an isolated DC-DC converter that the first voltage supply device 93 includes. The first isolated DC-DC converter may be positioned between the power source 91 and the first piezoelectric stack assembly 51. One end of the first isolated DC-DC converter may be electrically connected to the power source 91. Another end of the first isolated DC-DC converter may be electrically connected to the first piezoelectric stack assembly 51.

The second voltage supply device 95 may include an isolated DC-DC converter. A second isolated DC-DC converter may refer to an isolated DC-DC converter that the second voltage supply device 95 includes. The second isolated DC-DC converter may be positioned between the power source 91 and the second piezoelectric stack assembly 53. One end of the second isolated DC-DC converter may be electrically connected to the power source 91. Another end of the second isolated DC-DC converter may be electrically connected to the second piezoelectric stack assembly 53. The second isolated DC-DC converter and the first isolated DC-DC converter may be disposed in parallel with respect to the power source 91.

Figure 7:
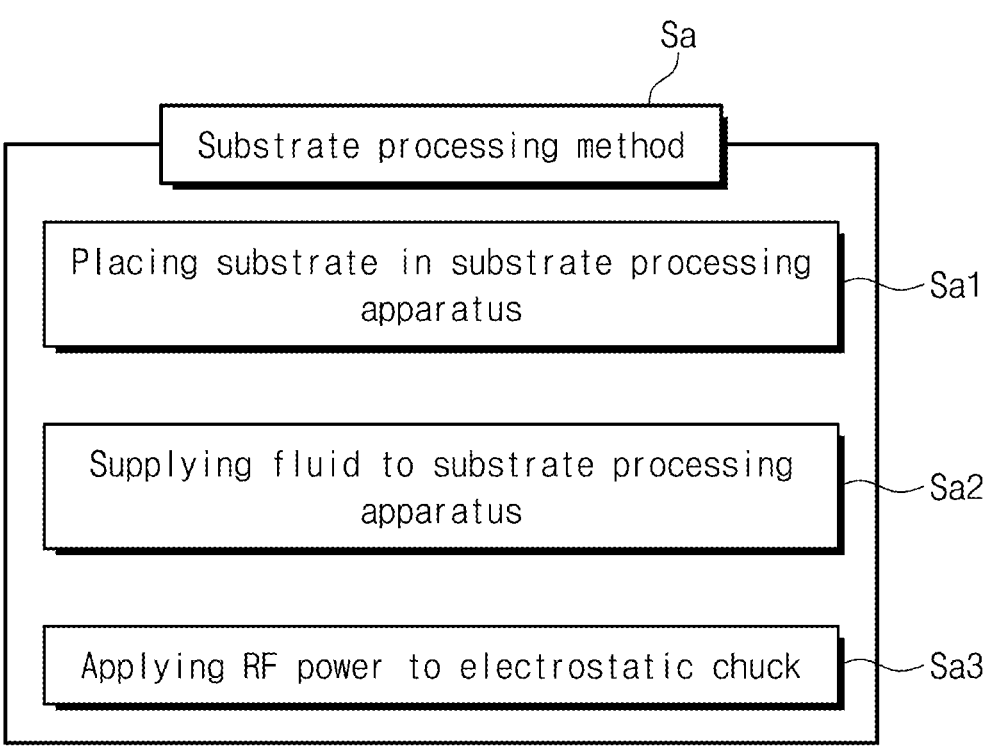
FIG. 7 illustrates a flow chart showing a substrate processing method according to embodiments of the present inventive concept.

FIG. 7 illustrates a flow chart showing a substrate processing method according to embodiments of the present inventive concept.

Referring to FIG. 7, a substrate processing method Sa may be provided. The substrate processing method Sa may be a way of processing a substrate by using the substrate processing apparatus SA and the gas supply system GS discussed with reference to FIGS. 1 to 6. The substrate processing method Sa may include placing a substrate in a substrate processing apparatus (Sa1), supplying a fluid to the substrate processing apparatus (Sa2), and applying a radio-frequency (RF) power to an electrostatic chuck (Sa3).

The fluid supply step Sa2 may include starting the supply of fluid to the substrate processing apparatus and changing a flow rate of fluid during the supply of fluid.

Figure 8:
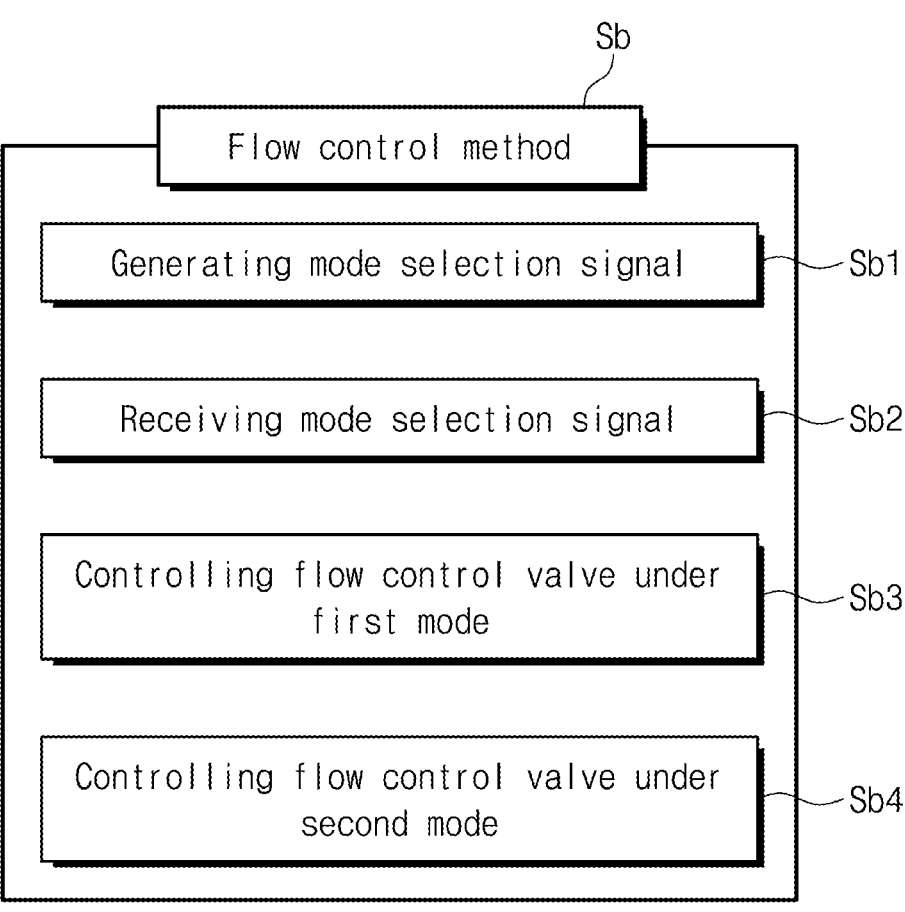
FIG. 8 illustrates a flow chart showing a flow control method according to embodiments of the present inventive concept.

FIG. 8 illustrates a flow chart showing a flow control method according to embodiments of the present inventive concept.

Referring to FIG. 8, a flow control method Sb may be provided. The flow control method Sb may be a method of controlling the gas supply system (see GS of FIG. 1). The flow control method Sb may be a portion of performing the fluid supply step Sa2. For example, the flow control method Sb may be a way of performing the step of changing a flow rate of fluid during the supply of fluid. The flow control method Sb may include generating a mode selection signal (Sb1), receiving the mode selection signal (Sb2), controlling a flow control valve under a first mode (Sb3), and controlling the flow control valve under a second mode (Sb4). The first mode and the second mode may be selectively performed. For example, the first mode and the second mode may not be performed at the same time. A detailed description thereof will be further discussed below.

With reference to FIGS. 9 to 14, the following will describe the substrate processing method Sa according to the flow chart of FIG. 7.

FIGS. 9 to 14 illustrate diagrams showing a substrate processing method according to the flow chart of FIG. 7.

Figure 9:
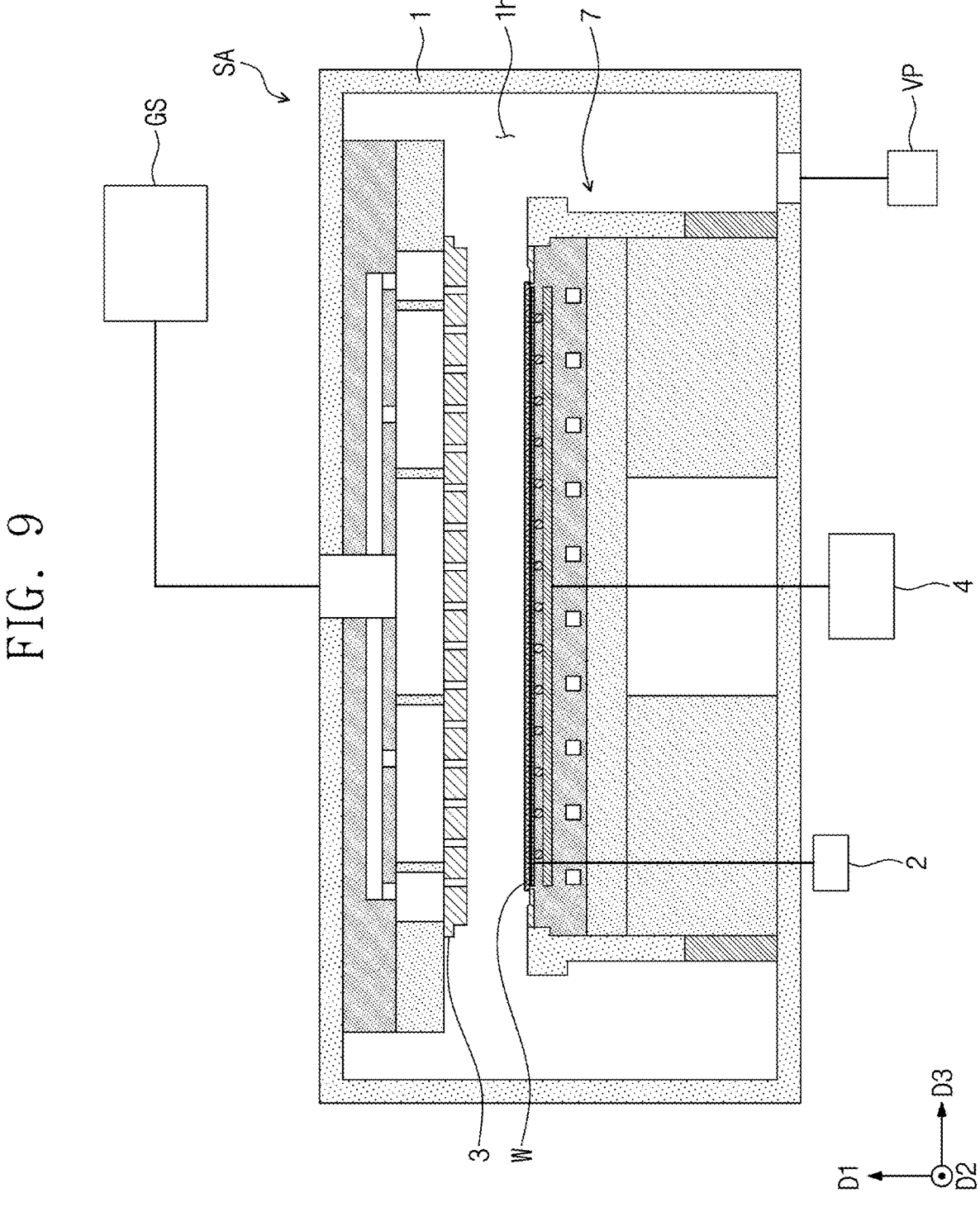
FIGS. 9 to 14 illustrate diagrams showing a substrate processing method according to the flow chart of FIG. 7.

Referring to FIGS. 7 and 9, the substrate placement step Sa1 may include placing a substrate W on the stage 7. For example, an electrostatic force may be used to rigidly pace the substrate W on a top surface of the stage 7.

Figure 10:
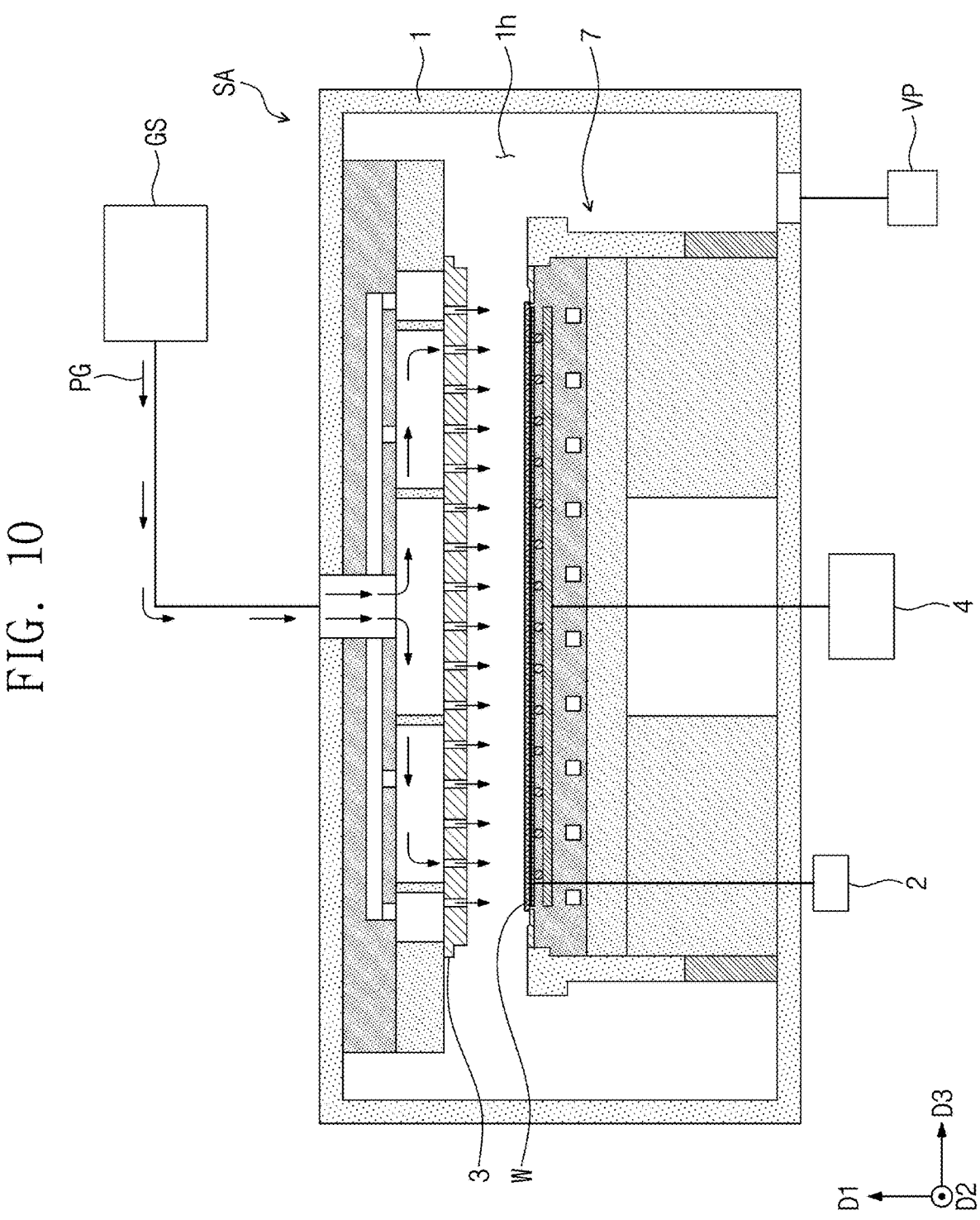

Referring to FIGS. 7 and 10, the fluid supply step Sa2 may include allowing the gas supply system GS to supply a fluid PG to the process space 1h. The fluid PG may be, for example, a process gas. The fluid PG may include one or more of an oxygen (O₂) gas, an argon (Ar) gas, and a neon (Ne) gas, but aspects of the present inventive concept are not limited thereto.

Referring to FIGS. 3 and 8, the signal generation step Sb1 may include receiving a target value of flow rate of fluid and selecting a mode for achieving the target value. The control part CP may receive the target value. For example, the control part CP may receive the target value stored in a CPU different from the control part CP. Alternatively, the target value may be stored in the control part CP. Dissimilarly, a user may use the interface part IP to input the target value to the control part CP. The selecting the mode for achieving the target value may include receiving information of current flow rate of fluid in the flow path FP. For example, the control part CP may receive, from the first and second flow sensors PS1 and PS2, information of current flow rate of fluid in the flow path FP. The control part CP may calculate a first value (e.g., delta value) that is a difference between the current flow rate and the target value. The control part CP may use the first value to generate the mode selection signal. For example, the control part CP may compare a magnitude of the first value with that of one or both of a first flow rate (e.g., "a first reference flow rate") and a second flow rate (e.g., "a second reference flow rate"). The first flow rate and the second flow rate may be a reference value for generating the mode selection signal. Each of the first flow rate and the second flow rate may be stored in the control part CP. The first flow rate may be different from the second flow rate. For example, the first flow rate may be less than the second flow rate. When the first value is less than the first flow rate, the control part CP may generate the mode selection signal that instructs to perform the first mode. When the first value is greater than the first flow rate, the control part CP may generate the mode selection signal that instructs to perform the second mode.

It is described that the signal generation step Sb1 is automatically performed by the control part CP, but aspects of the present inventive concept are not limited thereto. For example, a user may input the mode selection signal. A user may use the interface part IP to input the mode selection signal to the control part CP. For example, a user may use the interface part IP to directly provide the control part CP with one or more of the current flow rate, the target value, and the first value. Alternatively, a user may use the interface part IP to directly input a mode.

The signal reception step Sb2 may include receiving the mode selection signal generated from the control part CP.

Figure 13:
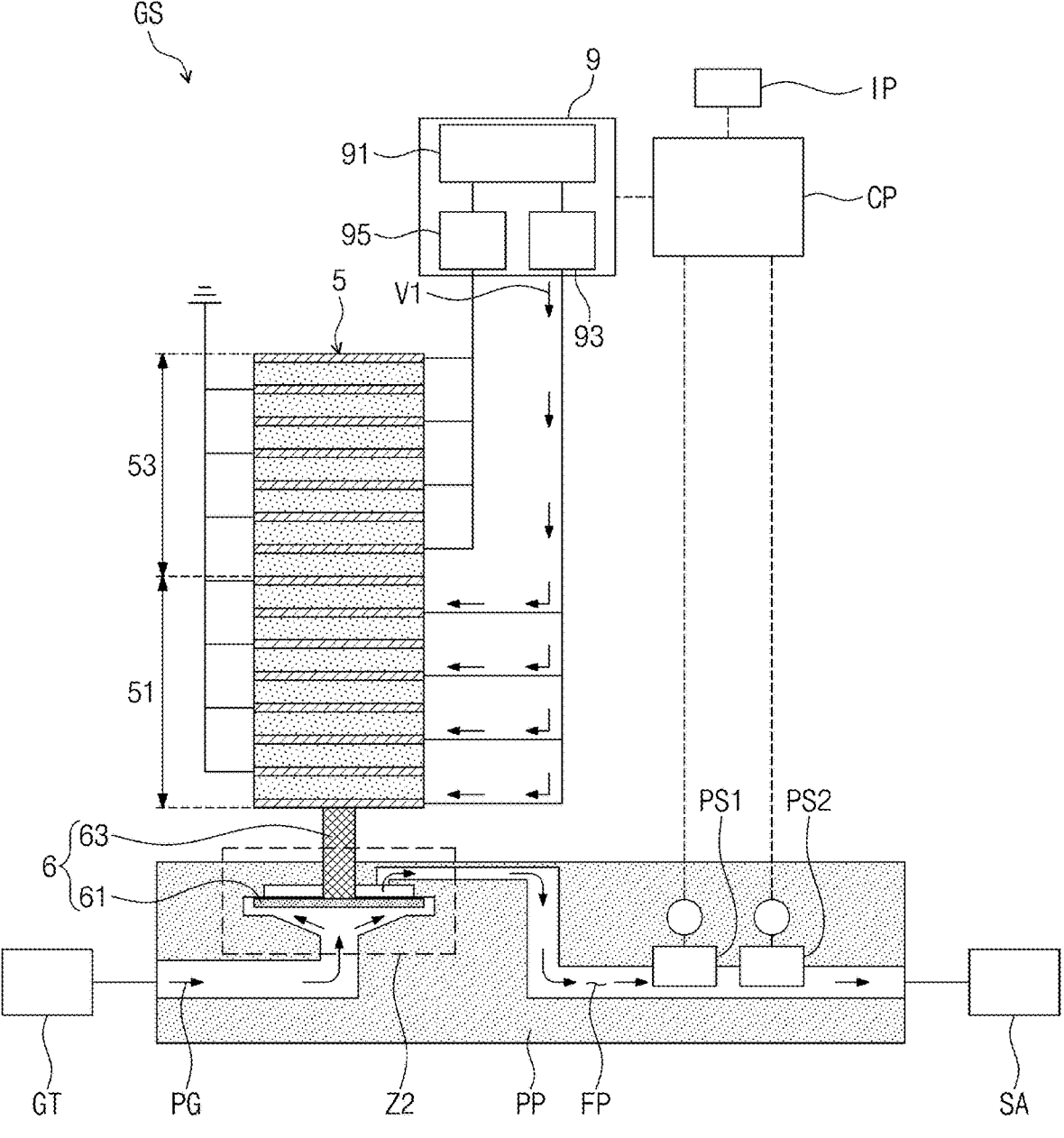
Figure 14:
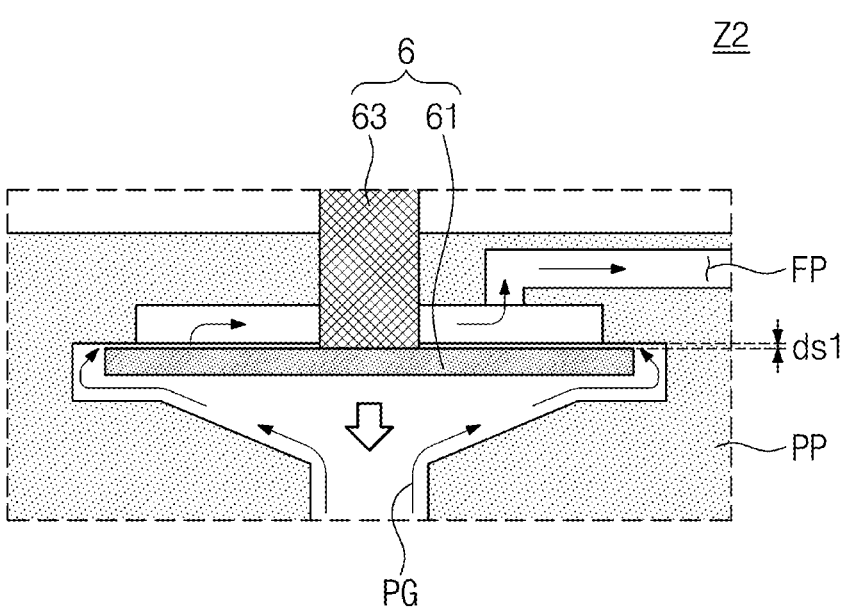

Referring to FIGS. 8, 13, and 14, the first mode step Sb3 may include, in response to the mode selection signal indicating the first mode, controlling the flow control valve 6 under the first mode. The controlling the flow control valve 6 under the first mode may include applying a first voltage V1 to the first piezoelectric stack assembly 51. The control part CP may use the voltage supply device 9 to apply the first voltage V1 to the first piezoelectric stack assembly 51. For example, the first voltage supply device 93 may convert a voltage supplied from the power source 91 into the first voltage V1, and may apply the first voltage V1 to the first piezoelectric stack assembly 51. There may thus be a change in volume of the first piezoelectric material layer of the first piezoelectric stack assembly 51. Thus, the flow control valve 6 may move. For example, the application of the first voltage V1 may cause the flow control valve 6 to travel a first distance ds1. Therefore, a flow rate of the fluid PG in the flow path FP may be changed by a first flow rate. In this procedure, a voltage applied to the second piezoelectric stack assembly 53 may not be changed. For example, in the first mode, a voltage applied to the second piezoelectric stack assembly 53 may not be changed.

Figure 11:
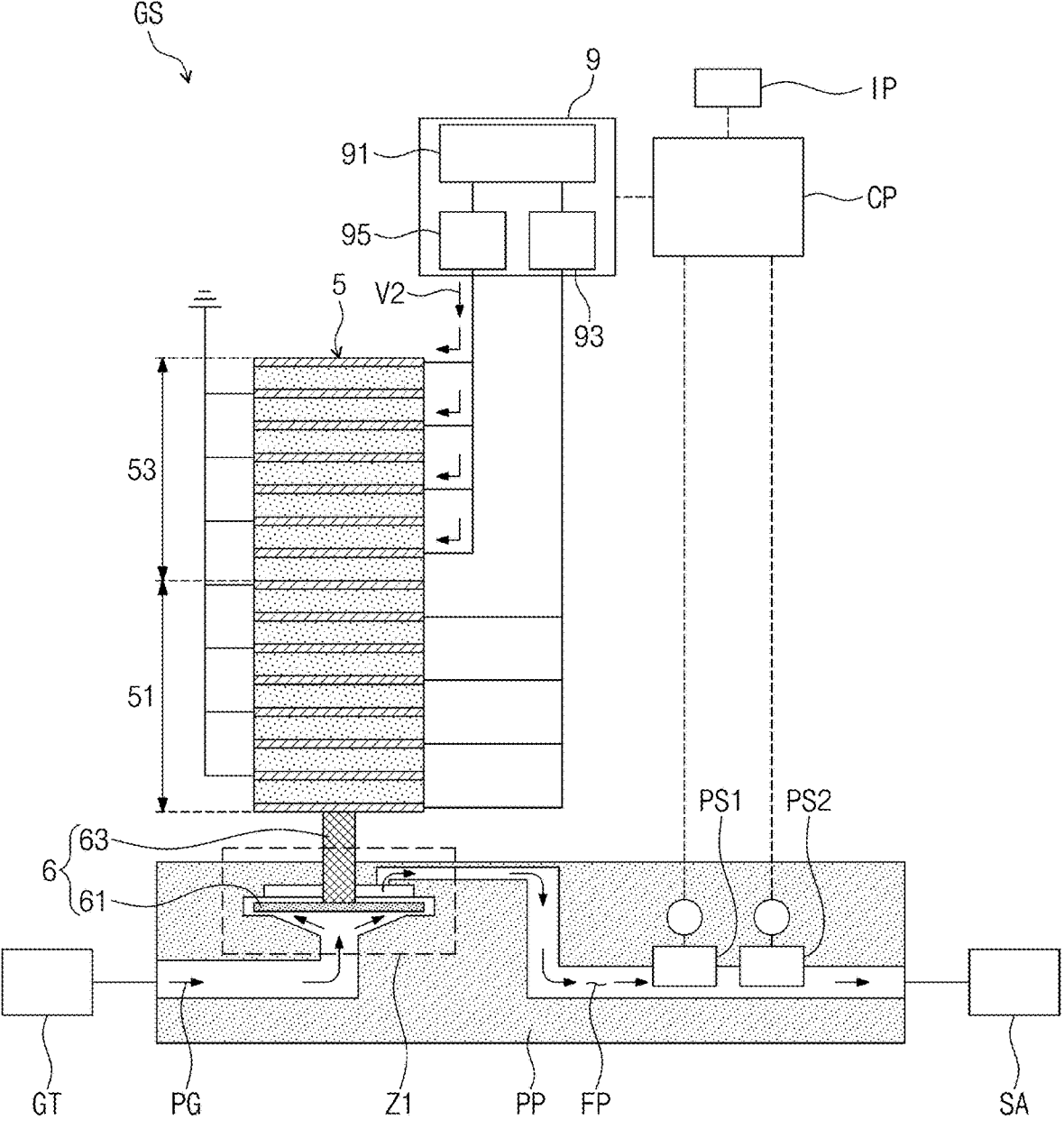
Figure 12:
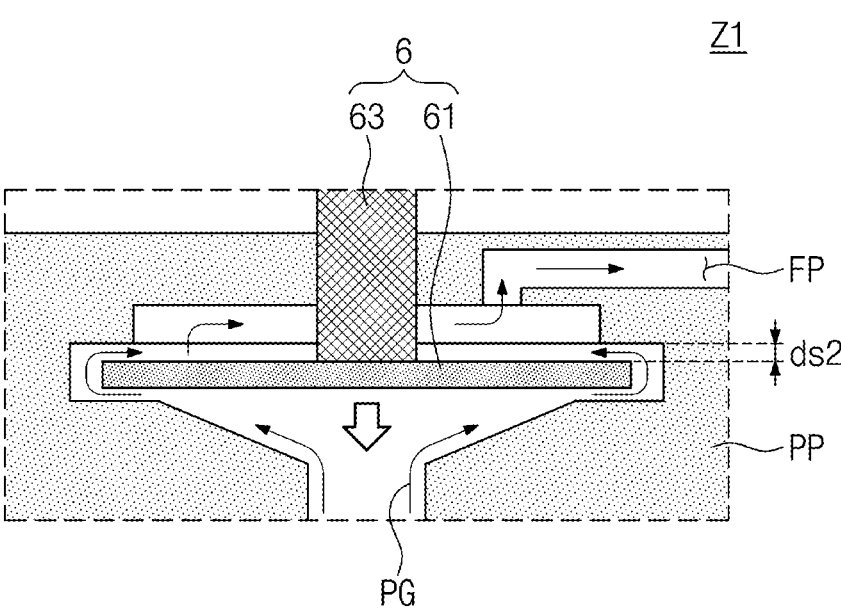

Referring to FIGS. 8, 11, and 12, the second mode step Sb4 may include, in response to the mode selection signal indicating the second mode, controlling the flow control valve 6 under the second mode. The controlling the flow control valve 6 under the second mode may include applying a second voltage V2 to the second piezoelectric stack assembly 53. The control part CP may use the voltage supply device 9 to apply the second voltage V2 to the second piezoelectric stack assembly 53. For example, the second voltage supply device 95 may convert a voltage supplied from the power source 91 into the second voltage V2, and may apply the second voltage V2 to the second piezoelectric stack assembly 53. There may thus be a change in volume of the second piezoelectric material layer of the second piezoelectric stack assembly 53. Thus, the flow control valve 6 may move. For example, the application of the second voltage V2 may cause the flow control valve 6 to travel a second distance ds2. Therefore, a flow rate of the fluid PG in the flow path FP may be changed by a second flow rate. In this procedure, a voltage applied to the first piezoelectric stack assembly 51 may not be changed. For example, in the second mode, a voltage applied to the first piezoelectric stack assembly 51 may not be changed.

The first voltage may be within a range that induces linear displacement of the first piezoelectric material. Thus, displacement of the first piezoelectric stack assembly 51 caused by the first voltage may be linear. The second voltage may be within a range that induces linear displacement of the second piezoelectric material. Thus, displacement of the second piezoelectric stack assembly 53 caused by the second voltage may be linear.

The first voltage may be less than the second voltage. The first flow rate may be less than the second flow rate. A flow rate of fluid in the first mode may be changed in a fine scale. For example, the first mode may be a mode for fine control. A flow rate of fluid in the second mode may be changed in a coarse scale. For example, the second mode may be a mode for coarse control.

According to a mass flow controller, a flow control method using the same, and a substrate processing method including the same in accordance with embodiments of the present inventive concept, a fine flow rate may be precisely controlled. For example, a single piezoelectric actuator may be used to precisely control a fine flow rate and to promptly control a coarse flow rate. Accordingly, even a single piezoelectric actuator may precisely control a wide range of flow rates. It may thus be possible to simplify an overall facility and to reduce a facility occupying area.

According to a mass flow controller, a flow control method using the same, and a substrate processing method including the same in accordance with embodiments of the present inventive concept, a single power source may supply a plurality of voltages. Thus, an overall facility may be simplified.

Figure 15:
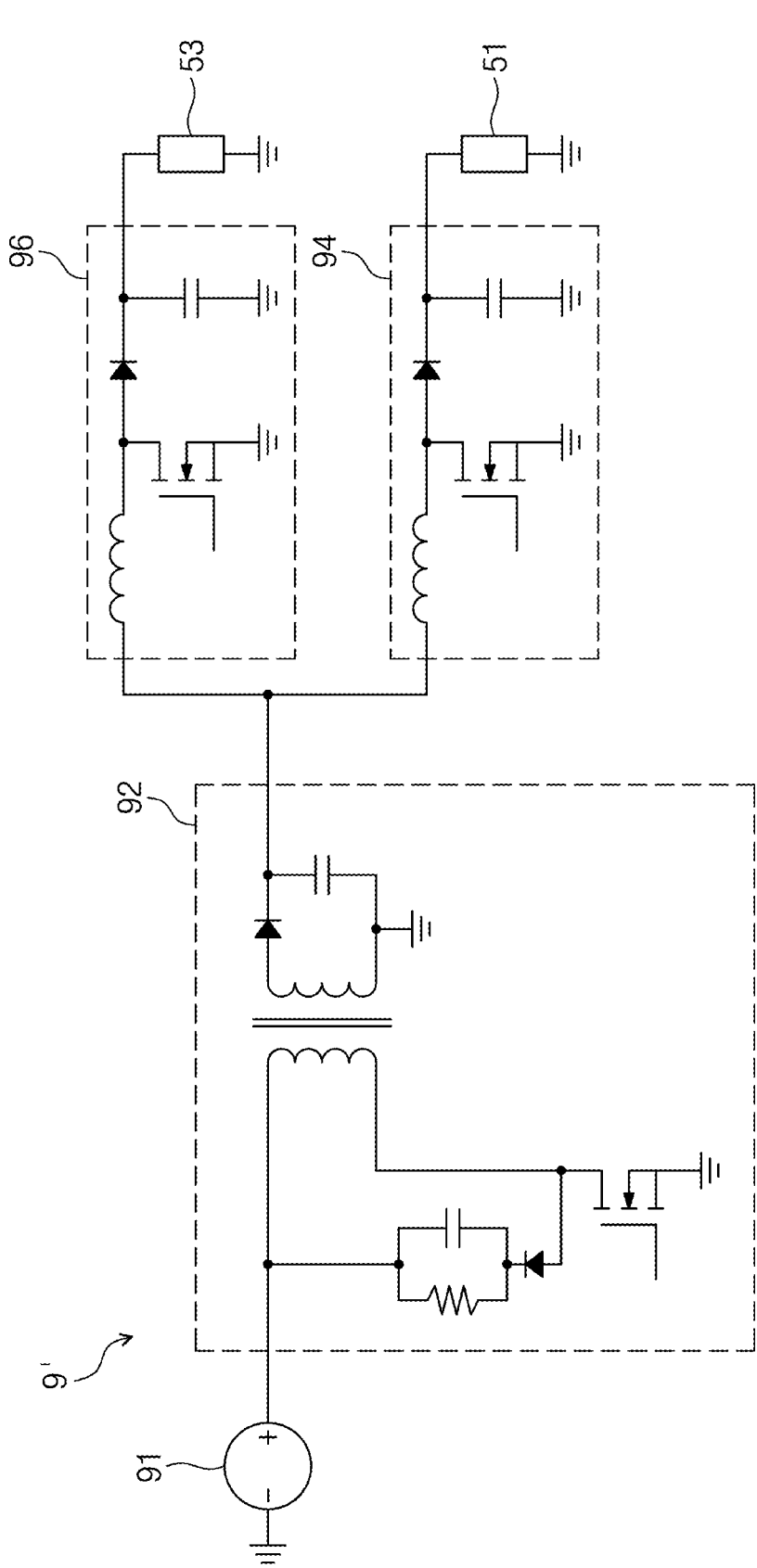
FIG. 15 illustrates a circuit diagram showing a voltage supply apparatus according to embodiments of the present inventive concepts.

FIG. 15 illustrates a circuit diagram showing a voltage supply apparatus according to embodiments of the present inventive concept.

The following will omit a description of components substantially the same as or similar to those discussed with reference to FIGS. 1 to 14.

Referring to FIG. 15, a voltage supply device 9' may include a power source 91, an isolated DC-DC converter 92, a first voltage supply device 94, and a second voltage supply device 96.

The power source 91 may include, for example, a direct-current power source. The isolated DC-DC converter 92 may be positioned between the power source 91 and the piezoelectric actuator (see 5 of FIG. 2). The isolated DC-DC converter 92 may include a flyback converter, but aspects of the present inventive concept are not limited thereto.

The first voltage supply device 94 may include a non-isolated DC-DC converter. A first non-isolated DC-DC converter may refer to a non-isolated DC-DC converter that the first voltage supply device 94 includes. The first non-isolated DC-DC converter may be positioned between the isolated DC-DC converter 92 and the first piezoelectric stack assembly 51. An end of the first non-isolated DC-DC converter may be electrically connected to the isolated DC-DC converter 92. Another end of the first non-isolated DC-DC converter may be electrically connected to the first piezoelectric stack assembly 51.

The second voltage supply device 96 may include a non-isolated DC-DC converter. A second non-isolated DC-DC converter may refer to a non-isolated DC-DC converter that the second voltage supply device 96 includes. The second non-isolated DC-DC converter may be positioned between the isolated DC-DC converter 92 and the second piezoelectric stack assembly 53. An end of the second non-isolated DC-DC converter may be electrically connected to the isolated DC-DC converter 92. Another end of the second non-isolated DC-DC converter may be electrically connected to the second piezoelectric stack assembly 53. The second non-isolated DC-DC converter and the first non-isolated DC-DC converter may be disposed in parallel with respect to the isolated DC-DC converter 92.

Two circuit diagrams are discussed with reference to FIGS. 6 and 15, configurations of voltage supply devices are not limited thereto. For example, the voltage supply device 9 may include other configuration for supply two voltages.

Figure 16:
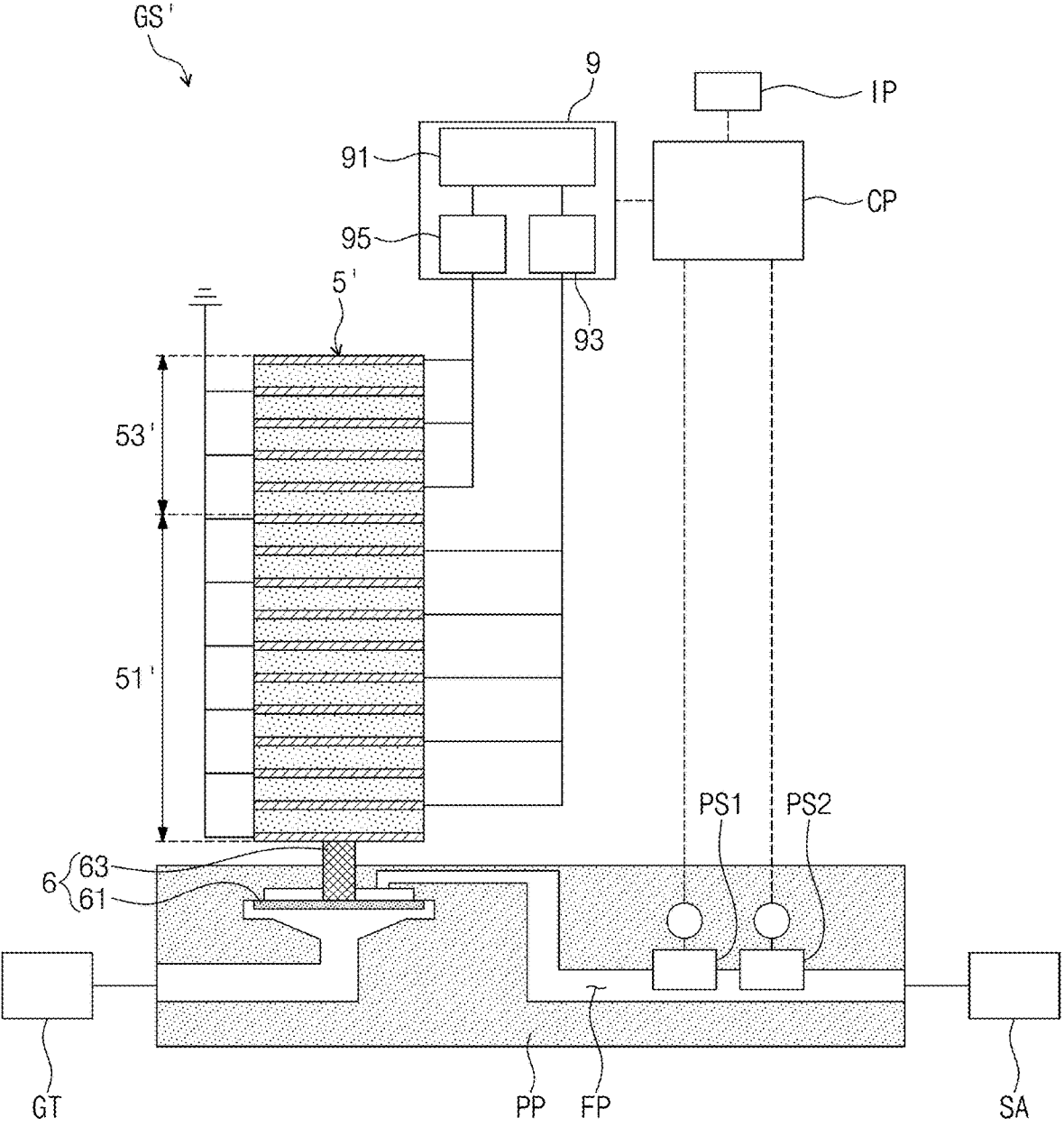
FIG. 16 illustrates a simplified schematic diagram showing a gas supply system according to embodiments of the present inventive concept.

FIG. 16 illustrates a simplified schematic diagram showing a gas supply system according to embodiments of the present inventive concept.

The following will omit a description of components substantially the same as or similar to those discussed with reference to FIGS. 1 to 15.

Referring to FIG. 16, a gas supply system GS' may include a piezoelectric actuator 5'. The piezoelectric actuator 5' may include a first piezoelectric stack assembly 51' and a second piezoelectric stack assembly 53'. The first piezoelectric stack assembly 51' may include a plurality of stacked first piezoelectric stacks. The second piezoelectric stack assembly 53' may include a plurality of stacked second piezoelectric stacks. The number of the plurality of first piezoelectric stacks may be different from the number of the plurality of second piezoelectric stacks. For example, as shown in FIG. 16, the number of the plurality of first piezoelectric stacks may be greater than the number of the plurality of second piezoelectric stacks.

According to a mass flow controller, a flow control method using the same, and a substrate processing method including the same in accordance with embodiments of the present inventive concept, the number of piezoelectric stacks for fine control may be different from the number of piezoelectric stacks for coarse control. It may thus be possible to control precisely and promptly.

Figure 17:
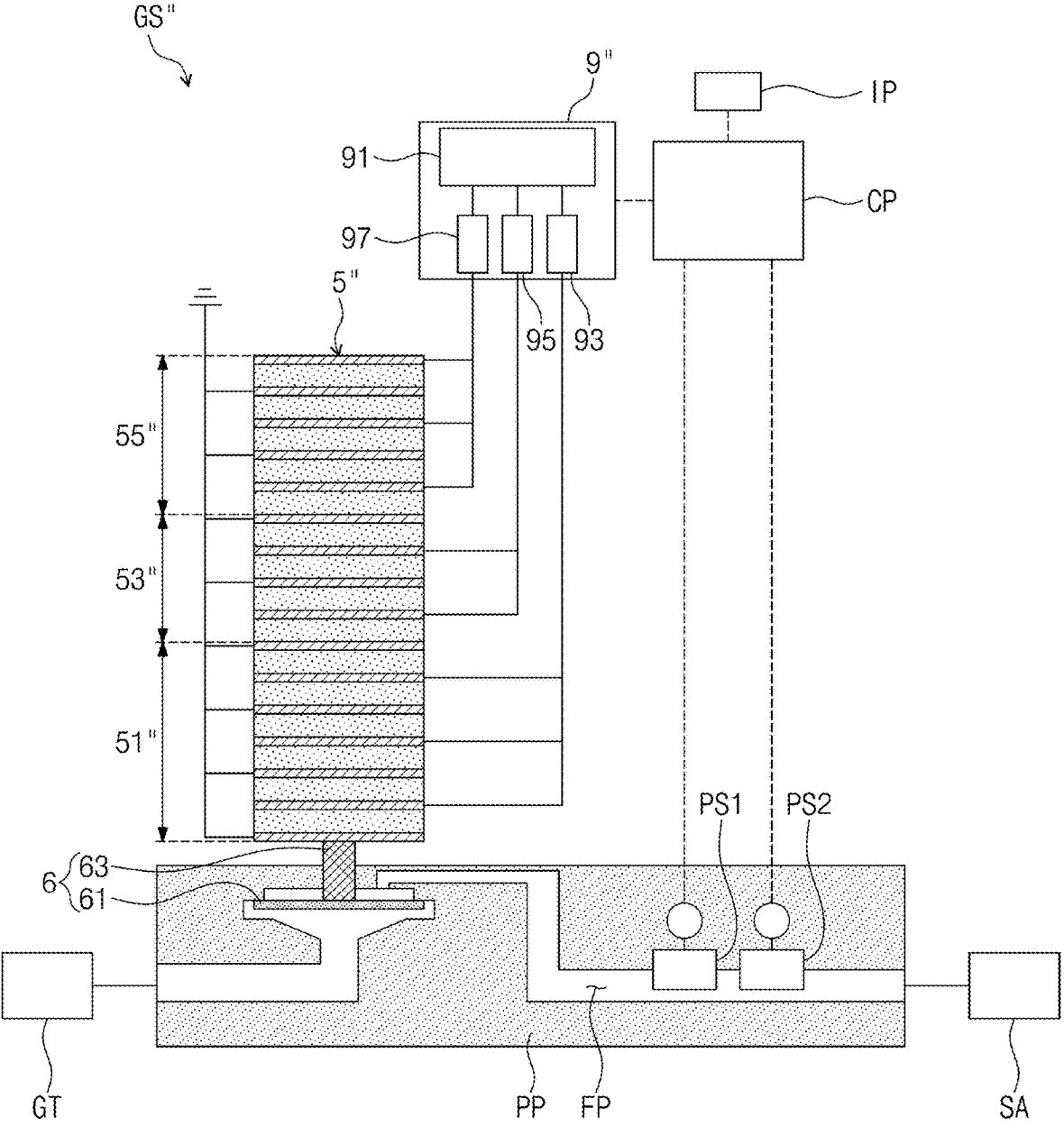
FIG. 17 illustrates a simplified schematic diagram showing a gas supply system according to embodiments of the present inventive concept.

FIG. 17 illustrates a simplified schematic diagram showing a gas supply system according to embodiments of the present inventive concept.

The following will omit a description substantially the same as or similar to that discussed with reference to FIGS. 1 to 16.

Referring to FIG. 17, a gas supply system GS" may include a piezoelectric actuator 5" and a voltage supply device 9". The piezoelectric actuator 5" may include a first piezoelectric stack assembly 51", a second piezoelectric stack assembly 53", and a third piezoelectric stack assembly 55". For example, unlike that discussed with reference to FIG. 3, the piezoelectric actuator 5" may further include the third piezoelectric stack assembly 55". The third piezoelectric stack assembly 55" may be stacked on the second piezoelectric stack assembly 53". The third piezoelectric stack assembly 55" may include a plurality of piezoelectric stacks. The voltage supply device 9" may further include a third voltage supply device 97. The third voltage supply device 97 may apply a third voltage to the third piezoelectric stack assembly 55".

According to a mass flow controller, a flow control method using the same, and a substrate processing method including the same in accordance with embodiments of the present inventive concept, a piezoelectric actuator may be supplied with three or more voltages. Therefore, a flow control valve may be controlled under three or more modes. Accordingly, it may possible to precisely and promptly change a flow rate.

Figure 18:
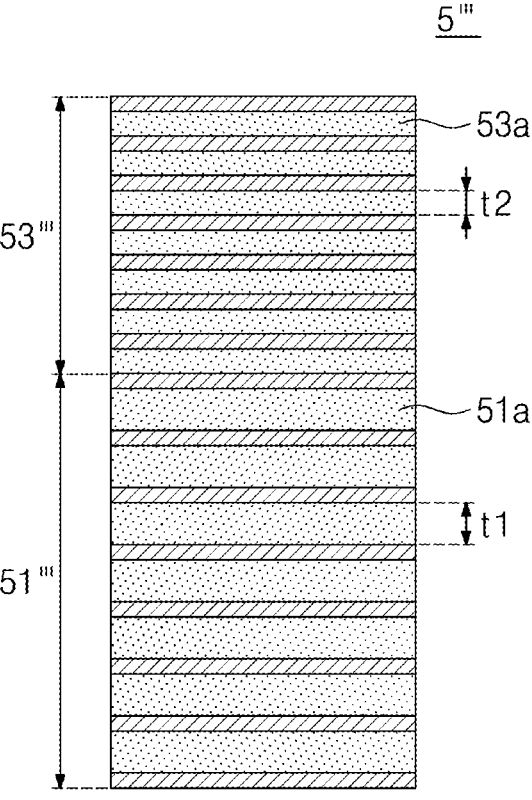
FIG. 18 illustrates a cross-sectional view showing a piezoelectric actuator according to embodiments of the present inventive concept.

FIG. 18 illustrates a cross-sectional view showing a piezoelectric actuator according to embodiments of the present inventive concept.

The following will omit a description substantially the same as or similar to that discussed with reference to FIGS. 1 to 17.

Referring to FIG. 18, a piezoelectric actuator 5''' may include a first piezoelectric stack assembly 51''' and a second piezoelectric stack assembly 53'''.

The first piezoelectric stack assembly 51''' may include a plurality of first piezoelectric stacks. Each of the plurality of first piezoelectric stacks may include a first piezoelectric material layer 51a and a first electrode.

The second piezoelectric stack assembly 53''' may include a plurality of second piezoelectric stacks. Each of the plurality of second piezoelectric stacks may include a second piezoelectric material layer 53a and a second electrode.

The second piezoelectric material layer 53a may have a size different from that of the first piezoelectric material layer 51a. For example, the second piezoelectric material layer 53a may have a thickness t2 different from a thickness t1 of the first piezoelectric material layer 51a. As shown in FIG. 18, the thickness t2 of the second piezoelectric material layer 53a may be less than the thickness t1 of the first piezoelectric material layer 51a. For example, the thickness t1 of the first piezoelectric material layer 51a may be greater than the thickness t2 of the second piezoelectric material layer 53a.

According to a mass flow controller, a flow control method using the same, and a substrate processing method including the same in accordance with embodiments of the present inventive concept, piezoelectric material layers to which different voltages are applied may have different thicknesses. For example, configurations may be provided which are correspondingly suitable for fine control and coarse control. Accordingly, it may be possible to precisely control a flow rate.

According to a mass flow controller, a flow control method using the same, and a substrate processing method including the same in accordance with embodiments of the present inventive concept, a fine flow rate may be precisely controlled.

According to a mass flow controller, a flow control method using the same, and a substrate processing method including the same in accordance with embodiments of the present inventive concept, a single piezoelectric actuator may be used to precisely control a wide range of flow rate.

According to a mass flow controller, a flow control method using the same, and a substrate processing method including the same in accordance with embodiments of the present inventive concept, an overall facility may be simplified.

According to a mass flow controller, a flow control method using the same, and a substrate processing method including the same in accordance with embodiments of the present inventive concept, a facility occupying area may be reduced.

Effects of the embodiments of the present inventive concept are not limited to the mentioned above, other effects which have not been mentioned above will be clearly understood to those skilled in the art from the following description.

Although aspects of the present inventive concept have been described in connection with embodiments of the present inventive concept illustrated in the accompanying drawings, it will be understood to those skilled in the art that various changes and modifications may be made without departing from the technical spirit and essential feature of aspects of the present inventive concepts. It therefore will be understood that the embodiments described above are just illustrative but not limitative in all aspects.

What is claimed is:

1. A flow control method of a substrate processing apparatus, the method comprising:

receiving a mode selection signal;

in response to the mode selection signal indicating a first mode, controlling a flow control valve under the first mode to allow a flow rate of fluid to change by a first flow rate, the flow control valve being connected to a flow path connecting a fluid supply system to the substrate processing apparatus, and the fluid flowing in the flow path; and in response to the mode selection signal indicating a second mode, controlling the flow control valve under the second mode to allow the flow rate of fluid in the flow path to change by a second flow rate, wherein controlling the flow control valve under the first mode includes applying a first voltage to a first piezoelectric stack assembly of a piezoelectric actuator connected to the flow control valve, wherein controlling the flow control valve under the second mode includes applying a second voltage to a second piezoelectric stack assembly disposed on the first piezoelectric stack assembly, the second voltage being different from the first voltage, and wherein the first flow rate is different from the second flow rate.

2. The flow control method of claim 1, wherein in controlling the flow control valve under the first mode, the first voltage is applied such that the flow control valve travels a first distance to thereby change the flow rate of fluid in the flow path by the first flow rate, and in controlling the flow control valve under the second mode, the second voltage is applied such that the flow control valve travels a second distance to thereby change the flow rate of fluid in the flow path by the second flow rate.

3. The flow control method of claim 2, wherein the first voltage is less than the second voltage, and the first flow rate is less than the second flow rate.

4. The flow control method of claim 3, further comprising:

generating the mode selection signal, wherein generating the mode selection signal includes:

receiving a target value of the flow rate of fluid in the flow path; and selecting a mode for achieving the target value, wherein selecting the mode for achieving the target value includes:

calculating a first value that is a difference between the target value and a current flow rate of fluid in the flow path; and

comparing a magnitude of the first value with magnitudes of a first reference flow rate and a second reference flow rate.

5. The flow control method of claim 1, further comprising:

in response to the mode selection signal indicating a third mode, controlling the flow control valve under the third mode to allow the flow rate of fluid in the flow path to change by a third flow rate, wherein controlling the flow control valve under the third mode includes applying a third voltage to a third piezoelectric stack assembly on the second piezoelectric stack assembly, wherein the third voltage is different from each of the first voltage and the second voltage, and wherein the third flow rate is different from the first flow rate and the second flow rate.

6. The flow control method of claim 1, wherein, in controlling the flow control valve under the first mode, a voltage applied to the second piezoelectric stack assembly is not changed.

7. The flow control method of claim 1, wherein the first piezoelectric stack assembly includes a plurality of first piezoelectric stacks that are stacked, wherein the second piezoelectric stack assembly includes a plurality of second piezoelectric stacks that are stacked, wherein each of the plurality of first piezoelectric stacks includes:

a first piezoelectric material layer that includes a first piezoelectric material; and a first electrode on the first piezoelectric material layer, wherein each of the plurality of second piezoelectric stacks includes:

a second piezoelectric material layer that includes a second piezoelectric material; and a second electrode on the second piezoelectric material layer, wherein the first voltage is within a range that induces linear displacement of the first piezoelectric material, and wherein the second voltage is within a range that induces linear displacement of the second piezoelectric material.

8. A substrate processing method, comprising:

placing a substrate in a substrate processing apparatus; and allowing a gas supply system to supply a process gas to the substrate processing apparatus, wherein supplying the process gas to the substrate processing apparatus includes:

starting to supply the process gas to the substrate processing apparatus; and changing a flow rate of the process gas during the supply of the process gas, wherein changing the flow rate of the process gas includes:

calculating a first value that is a difference between a target value of the flow rate of the process gas and a current flow rate of the process gas; and controlling a flow control valve of the gas supply system based on the first value, wherein controlling the flow control valve includes:

when the first value is less than a first reference flow rate, controlling the flow control valve under a first mode; and

16 when the first value is greater than the first reference flow rate, controlling the flow control valve under a second mode, wherein controlling the flow control valve under the first mode includes applying a first voltage to a first piezoelectric stack assembly of a piezoelectric actuator connected to the flow control valve, and wherein controlling the flow control valve under the second mode includes applying a second voltage to a second piezoelectric stack assembly on the first piezoelectric stack assembly, the second voltage being greater than the first voltage.

9. The substrate processing method of claim 8, wherein the first piezoelectric stack assembly includes a plurality of first piezoelectric stacks that are stacked, the second piezoelectric stack assembly includes a plurality of second piezoelectric stacks that are stacked, and the number of the plurality of first piezoelectric stacks is different from the number of the plurality of second piezoelectric stacks.

10. The substrate processing method of claim 9, wherein each of the plurality of first piezoelectric stacks includes:

a first piezoelectric material layer that includes a first piezoelectric material; and a first electrode on the first piezoelectric material layer, wherein each of the plurality of second piezoelectric stacks includes:

a second piezoelectric material layer that includes a second piezoelectric material; and a second electrode on the second piezoelectric material layer, wherein the first voltage causes a volume of the first piezoelectric material to change within a range of linear displacement of the first piezoelectric material, and wherein the second voltage causes that volume of the second piezoelectric material to change within a range of linear displacement of the second piezoelectric material.

11. The substrate processing method of claim 8, wherein the substrate processing apparatus includes a plasma etching apparatus, wherein the plasma etching apparatus includes:

a process chamber that provides a process space; and an electrostatic chuck in the process chamber and configured to support the substrate.

12. The substrate processing method of claim 11, further comprising:

applying a radio-frequency (RF) power to the electrostatic chuck to generate plasma in the process space.

13. The substrate processing method of claim 12, wherein the process gas includes an oxygen ($O_2$) gas.

14. A mass flow controller of a substrate processing apparatus, comprising:

a flow control valve disposed in a flow path connecting a gas supply system to the substrate processing apparatus;

a piezoelectric actuator connected to the flow control valve and configured to drive the flow control valve; and a voltage supply device that applies a voltage to the piezoelectric actuator, wherein the piezoelectric actuator includes:

a first piezoelectric stack assembly that includes a plurality of first piezoelectric stacks; and a second piezoelectric stack assembly that includes a plurality of second piezoelectric stacks and is disposed on the first piezoelectric stack assembly, and wherein the voltage supply device includes:

a first voltage supply device electrically connected to the first piezoelectric stack assembly so as to apply a first voltage to the first piezoelectric stack assembly; and a second voltage supply device electrically connected to the second piezoelectric stack assembly so as to apply a second voltage to the second piezoelectric stack assembly;

wherein the mass flow controller further comprises a processing unit configured to selectively cause either the first voltage to be provided to the first piezoelectric stack assembly or the second voltage to be provided to the second piezoelectric stack assembly.

15. The mass flow controller of claim 14, wherein the voltage supply device further includes a power source that supplies a voltage to the first voltage supply device and the second voltage supply device, wherein the first voltage supply device includes a first isolated DC-DC converter between the power source and the first piezoelectric stack assembly, and wherein the second voltage supply device includes a second isolated DC-DC converter between the power source and the second piezoelectric stack assembly, the second isolated DC-DC converter and the first isolated DC-DC converter being in parallel with respect to the power source.

16. The mass flow controller of claim 14, wherein the voltage supply device includes:

a power source that supplies a voltage to the first voltage supply device and the second voltage supply device; and an isolated DC-DC converter between the power source and the piezoelectric actuator, wherein the first voltage supply device includes a first non-isolated DC-DC converter between the isolated DC-DC converter and the first piezoelectric stack assembly, wherein the second voltage supply device includes a second non-isolated DC-DC converter between the isolated DC-DC converter and the second piezoelectric stack assembly, wherein the first non-isolated DC-DC converter and the second non-isolated DC-DC converter are in parallel with respect to the isolated DC-DC converter.

17. The mass flow controller of claim 14, wherein each of the plurality of first piezoelectric stacks includes:

a first piezoelectric material layer; and a first electrode on the first piezoelectric material layer, wherein each of the plurality of second piezoelectric stacks includes:

a second piezoelectric material layer; and a second electrode on the second piezoelectric material layer, wherein a thickness of the second piezoelectric material layer is different from a thickness of the first piezoelectric material layer.

18. The mass flow controller of claim 17, wherein the second voltage is less than the first voltage, and the thickness of the second piezoelectric material layer is less than the thickness of the first piezoelectric material layer.

19. The mass flow controller of claim 14, further comprising a flow sensor that measures a flow rate in the flow path.

20. The mass flow controller of claim 14, wherein the piezoelectric actuator further includes a third piezoelectric stack assembly on the second piezoelectric stack assembly, the third piezoelectric stack assembly including a plurality of third piezoelectric stacks, and the voltage supply device is electrically connected to the third piezoelectric stack assembly so as to apply a third voltage to the third piezoelectric stack assembly.

* * * * *